(12) United States Patent
Jeong et al.

(10) Patent No.: US 7,092,283 B2
(45) Date of Patent: Aug. 15, 2006

(54) MAGNETIC RANDOM ACCESS MEMORY DEVICES INCLUDING HEAT GENERATING LAYERS AND RELATED METHODS

(75) Inventors: Won-Cheol Jeong, Seoul (KR); Chang-Wook Jeong, Seoul (KR); Hyeong-Jun Kim, Seoul (KR); Jae-Hyun Park, Gyeonggi-do (KR)

(73) Assignee: Samsung Electronics Co., Ltd., Kyungki-Do (KR)

( * ) Notice: Subject to any disclaimer, the term of this patent is extended or adjusted under 35 U.S.C. 154(b) by 0 days.

(21) Appl. No.: 10/795,600

(22) Filed: Mar. 8, 2004

(65) Prior Publication Data

US 2005/0078510 A1  Apr. 14, 2005

(30) Foreign Application Priority Data

Sep. 29, 2003  (KR) .................. P10-2003-0067530

(51) Int. Cl.
*G11C 11/00* (2006.01)
*G11C 11/14* (2006.01)

(52) U.S. Cl. .................. 365/158; 365/171; 365/173
(58) Field of Classification Search ............... 365/158, 365/171, 173, 211
See application file for complete search history.

(56) References Cited

U.S. PATENT DOCUMENTS

| 6,130,814 | A | 10/2000 | Sun |
| 6,163,477 | A | 12/2000 | Tran |
| 6,385,082 | B1 | 5/2002 | Abraham et al. |
| 6,385,083 | B1 | 5/2002 | Sharma et al. |
| 6,430,085 | B1 | 8/2002 | Rizzo |
| 6,509,621 | B1 | 1/2003 | Nakao |
| 6,545,906 | B1 | 4/2003 | Savtchenko et al. |
| 6,560,135 | B1 | 5/2003 | Matsuoka et al. |
| 6,603,677 | B1 | 8/2003 | Redon et al. |
| 6,603,678 | B1 | 8/2003 | Nickel et al. |
| 6,720,597 | B1 | 4/2004 | Janesky et al. |
| 6,724,674 | B1 * | 4/2004 | Abraham et al. ........... 365/211 |
| 6,744,651 | B1 * | 6/2004 | Tang ........................ 365/158 |
| 6,762,953 | B1 * | 7/2004 | Tanizaki et al. ............ 365/158 |
| 6,771,534 | B1 * | 8/2004 | Stipe ........................ 365/158 |
| 6,791,874 | B1 * | 9/2004 | Tran et al. .................. 365/158 |
| 6,794,696 | B1 | 9/2004 | Fukuzumi |
| 2002/0176277 | A1 | 11/2002 | Bessho et al. |

(Continued)

FOREIGN PATENT DOCUMENTS

JP  2001-084757  3/2001

(Continued)

OTHER PUBLICATIONS

Boeck et al. "Spintronics, a New Nanoelectronics Adventure" thinfilmmfg.com 5 pages (2002) <http://www.thinfilmmfg.com/subscribers/Subscriber02/spin1May02.htm> Accessed online on May 20, 2005.

(Continued)

*Primary Examiner*—Trong Phan
(74) *Attorney, Agent, or Firm*—Myers Bigel, Sibley & Sajovec

(57) ABSTRACT

A magnetic random access memory device may include a first electrode on a substrate, a magnetic tunneling junction element electrically connected to the electrode, and a second electrode electrically connected to the first electrode through the magnetic tunneling junction element. In addition, a heat generating layer may be electrically connected in series between the first and second electrodes, and the heat generating layer may provide a relatively high resistance with respect to electrical current flow. Related methods are also discussed.

63 Claims, 18 Drawing Sheets

U.S. PATENT DOCUMENTS

| | | |
|---|---|---|
| 2003/0170976 A1 | 9/2003 | Molla et al. |
| 2005/0078510 A1 | 4/2005 | Jeong et al. |

FOREIGN PATENT DOCUMENTS

| | | |
|---|---|---|
| JP | 2001-084758 | 3/2001 |
| JP | 2001-250206 | 9/2001 |
| JP | 2002-319664 | 10/2002 |
| JP | 2004-087519 | 3/2004 |
| JP | 2002-319664 | 10/2005 |
| KR | 1020020046036 | 6/2002 |
| KR | 1020030040027 | 5/2003 |
| KR | 1020040003479 | 1/2004 |
| KR | 1020040026619 | 3/2004 |
| KR | 1020040038420 | 5/2004 |
| WO | WO 2004/049344 | 6/2004 |

OTHER PUBLICATIONS

Deak "Spin Injection in Thermally Assisted Magnetic Random Access Memory" 15 pages <http://www.nve.com/advpdf/49_MMM_spin_injection_TA_MRAM.pdf> Accessed online on Jun. 20, 2005.

Fert et al. "The New Era of Spintronics" *Europhysics News* 34(6) 7 pages (2003) <http://www.europhysicsnews.com/full/24/article9/article9.html> Accessed online on Jun. 20, 2005.

Johnson "Magnetic Spin Locks data into MRAMs" *EETimes Online* (Jul. 17, 2001) 4 pages <http://www.eetimes.com/story/OEG20010717S0064> Accessed online on Apr. 18, 2005.

\* cited by examiner

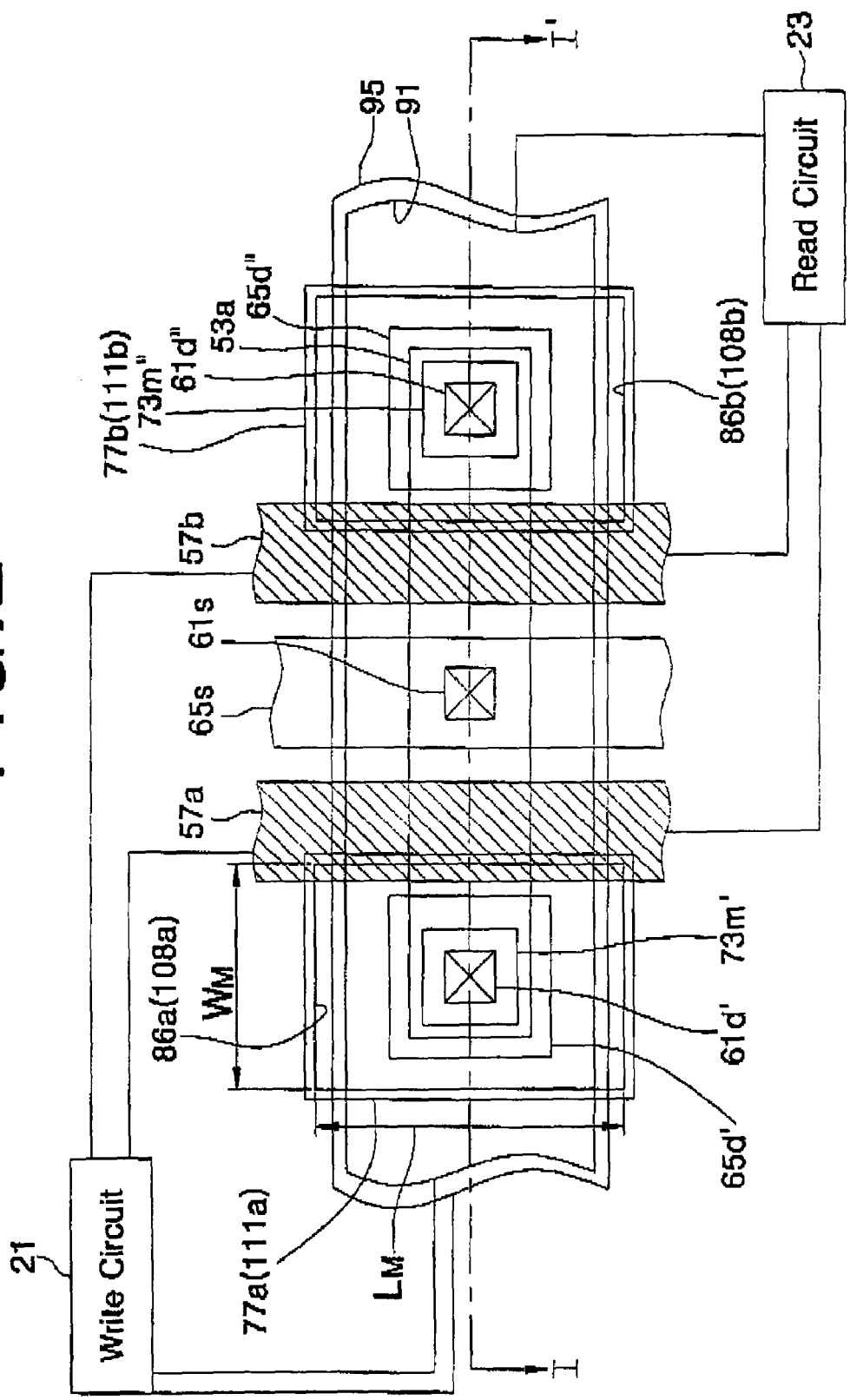

MAGNETIC RANDOM ACCESS MEMORY DEVICES INCLUDING HEAT GENERATING LAYERS AND RELATED METHODS

RELATED APPLICATIONS

The present application claims the benefit of priority from Korean Application No. P2003-0067530 filed Sep. 29, 2003, the disclosure of which is hereby incorporated herein in its entirety by reference.

FIELD OF THE INVENTION

The present invention relates to the field of memory devices and more particularly to magnetic random access memory devices and methods.

BACKGROUND OF THE INVENTION

A magnetic random access memory (MRAMs) may provide non-volatile memory that can operate at relatively low voltage and at relatively high speed. In a magnetic random access memory cell, data is stored in a magnetic resistor including a magnetic tunneling junction (MTJ) element having first and second ferromagnetic layers and a tunneling insulating layer therebetween. More particularly, a magnetic polarization of the first ferromagnetic layer (also referred to as a free layer) may be changed using a magnetic field that crosses the MTJ element. The magnetic field may be induced by an electric current passing adjacent to the MTJ element.

Accordingly, the magnetic polarization of the free layer can be parallel or anti-parallel to a magnetic polarization of the second ferromagnetic layer (also referred to as a pinned layer). As a result of spintronics based on quantum mechanics, an electrical resistance of a current path through the MTJ element when the magnetic polarization of the free layer is parallel to the magnetic polarization of the pinned layer is different than an electrical resistance of the current path through the MTJ element when the magnetic polarization of the free layer is anti-parallel to the magnetic polarization of the pinned layer. A memory cell including an MTJ element can thus be programmed by setting the magnetic polarization of the free layer according to a value of the data to be programmed, and data can be read from the memory cell by measuring an electrical resistance through the MTJ element.

A magnetic tunneling junction element may include a pinning layer 11, a pinned magnetic layer 13, a tunneling insulating layer 15, and a free magnetic layer 17, as shown in FIGS. 1A–B. The pinning layer 11 may be a layer of an anti-ferromagnetic material such as FeMn (iron-manganese). The pinned and free magnetic layers 13 and 17 may be layers of the same or different ferromagnetic materials such as CoFe (cobalt-iron) and/or NiFe (nickel-iron). The tunneling insulating layer 15 may be a layer of an insulating material such as $Al_2O_3$ (aluminum oxide).

A ferromagnetic material has a macroscopic magnetization without an external magnetic field, and electron spins can be lined up in the same direction at a relatively low temperature. Magnetic regions of a ferromagnetic material may be aligned using an external magnetic field, and the alignment of the magnetic regions of the ferromagnetic material may be maintained after removing the external magnetic field. In an anti-ferromagnetic material, spins of atoms may be in an alternate anti-parallel arrangement. An anti-ferromagnetic material may thus have microscopic magnetic properties but not macroscopic magnetic properties.

The pinned magnetic layer 13 may be fixed by heating the pinned magnetic layer 13 to 300° C. (degrees C.) while applying an external magnetic field. After the heat treatment, the fixed magnetic spins in the pinned magnetic layer 13 may not rotate. Because the pinning layer 11 is in contact with the pinned layer 13, magnetic spins of the pinned layer 13 may be permanently fixed. Magnetic spins of the free layer 17, however, may rotate in the presence of an external magnetic field because the free layer 17 is separated from the pinning layer 11.

When the magnetic polarization of the free magnetic layer 17 is set parallel to the magnetic polarization of the pinned magnetic layer 13, an electrical resistance with respect to a current i through the magnetic tunneling junction element may be relatively low representing a "0" state of a bit of data programmed in the memory cell including the MTJ element. When the magnetic polarization of the free magnetic layer 17 is set anti-parallel to the magnetic polarization of the pinned magnetic layer 13, an electrical resistance with respect to a current i through the magnetic tunneling junction element may be relatively high representing a "1" state of a bit of data programmed in the memory cell including the MTJ element. By applying a same voltage across the MTJ element, a resulting current i may thus be relatively high or low due to a resistance of the MTJ element to indicate a state ("0" or "1") of a bit of data programmed in the MTJ element.

Thermally assisted magnetic random access memories are discussed, for example, in U.S. Pat. No. 6,385,082, the disclosure of which is incorporated herein in its entirety by reference. In the '082 patent, a storage cell is disposed at an intersection of a bit line and a word line, and a cell can be selected using a brief pulse of tunneling current between the intersecting bit and word lines to provide sufficient Joule heating to facilitate a change in the magnetization state of its reversible magnetic layer.

In addition, thermally assisted switching of magnetic memory elements is discussed in U.S. Pat. No. 6,603,678, the disclosure of which is incorporated herein in its entirety by reference. In the '678 patent, a magnetic memory element is written to by heating the memory element and applying at least one magnetic field to the memory element.

SUMMARY

According to embodiments of the present invention, a magnetic random access memory device includes a first electrode on a substrate, a magnetic tunneling junction element electrically connected to the electrode, and a second electrode electrically connected to the first electrode through the magnetic tunneling junction element. In addition, a heat generating layer is electrically connected in series with the magnetic tunneling junction element between the first and second electrodes, and the heat generating layer provides a relatively high resistance with respect to electrical current flow.

More particularly, the first electrode may be an electrode of a memory cell access transistor (such as a source/drain region of a field effect transistor), and the second electrode may be a bit line. In addition, the heat generating layer may include an insulating material such as aluminum oxide, silicon, silicon carbide, silicon oxide, silicon oxynitride, and/or a chalcogenide material, and the heat generating layer may have a thickness less than approximately 30 Å.

The magnetic tunneling junction element may include a free layer, a tunneling insulating layer, and a pinned layer with the tunneling insulating layer being between the free and pinned layers. In addition, the magnetic tunneling junction element may also include a pinning layer on or under the pinned layer such that the pinned layer is between the pinning layer and the tunneling insulating layer. The free layer may be between the heat generating layer and the pinned layer, or the pinned layer may be between the heat generating layer and the free layer.

Moreover, the heat generating layer may be between the magnetic tunneling junction element and the second electrode with the second electrode being a bit line, and a surface area of an electrical connection between the heat generating layer and the bit line may be less than a surface area of the heat generating layer. In an alternative, the heat generating layer may be between the magnetic tunneling junction element and the first electrode on the substrate, and a conductive plug may be electrically connected between the heat generating layer and the first electrode on the substrate with a surface area of an electrical connection between the heat generating layer and the conductive plug being less than a surface area of the heat generating layer.

A write circuit may be configured to write data to the magnetic tunneling junction element by generating a heating current between the first and second electrodes through the magnetic tunneling junction element and the heat generating layer and by generating a programming current in a direction different than a direction of the heating current. In addition, a read circuit may be configured to read data from the magnetic tunneling junction element by detecting a resistance of the magnetic tunneling junction element. More particularly, the second electrode may be a bit line, and the write circuit may be configured to generate the programming current through the bit line.

Moreover, the second electrode may be a bit line, an insulating layer may be provided on the bit line so that the bit line is between the insulating layer and the magnetic tunneling junction element, and a sub-bit line may be provided on the insulating layer so that the insulating layer is between the sub-bit line and the bit line. The sub-bit line and the bit line may be parallel. In addition, a write circuit may be configured to write data to the magnetic tunneling junction element by generating a heating current between the first electrode and the bit line through the magnetic tunneling junction element and the heat generating layer and by generating a programming current through the sub-bit line while generating the heating current.

In an alternative, the second electrode may be a bit line, an insulating layer may be provided on the bit line so that the bit line is between the insulating layer and the magnetic tunneling junction element, and a digit line may be provided on the insulating layer so that the insulating layer is between the digit line and the bit line. In addition, a write circuit may be configured to write data to the magnetic tunneling junction element by generating a heating current between the first electrode and the bit line through the magnetic tunneling junction element and the heat generating layer and by generating a programming current though the digit line while generating the heating current. The digit line may be perpendicular with respect to the bit line.

According to additional embodiments of the present invention, a magnetic random access memory device includes a memory cell access transistor (such as a field effect transistor) having an electrode (such as a source region or drain region) on a substrate and a magnetic tunneling junction element electrically connected to the electrode of the memory cell access transistor. A bit line is electrically connected to the electrode of the memory cell access transistor through the magnetic tunneling junction element. In addition, a write circuit is configured to write data to the magnetic tunneling junction element by generating a heating current between the bit line and the electrode of the memory cell access transistor through the magnetic tunneling junction element while the memory access transistor is turned on, and by generating a programming current in a direction different than a direction of the heating current while generating the heating current.

In addition, an insulating layer may be provided on the bit line so that the bit line is between the insulating layer and the magnetic tunneling junction element, and a sub-bit line may be provided on the insulating layer so that the insulating layer is between the sub-bit line and the bit line. Moreover, the write circuit may be configured to generate the programming current through the sub-bit line while generating the heating current. More particularly, the sub-bit line and the bit line may be parallel.

In an alternative, an insulting layer may be provided on the bit line so that the bit line is between the insulating layer and the magnetic tunneling junction element, and a digit line may be provided on the insulating layer so that the insulating layer is between the digit line and the bit line. In addition, the write circuit may be configured to generate the programming current through the digit line while generating the heating current, and the digit line and the bit line may be perpendicular. In another alternative, the write circuit may be configured to generate the programming current through the bit line.

A heat generating layer may be electrically connected in series with the magnetic tunneling junction element between the bit line and the electrode of the memory cell access transistor, with the heat generating layer providing a relatively high resistance with respect to electrical current flow. More particularly, the heat generating layer may be a layer of an insulating material such as aluminum oxide, silicon, silicon carbide, silicon oxide, silicon oxynitride, and/or a chalcogenide material, and the heat generating layer may have a thickness less than approximately 30 Å.

The magnetic tunneling junction element may include a free layer, a tunneling insulating layer, and a pinned layer with the tunneling insulating layer being between the free and pinned layers. A pinning layer may also be included on the pinned layer such that the pinned layer is between the pinning layer and the tunneling insulating layer. The free layer may be between the heat generating layer and the pinned layer, or the pinned layer may be between the heat generating layer and the free layer.

Moreover, the heat generating layer may be between the magnetic tunneling junction element and the bit line, and a surface area of an electrical connection between the heat generating layer and the bit line may be less than a surface area of the heat generating layer. In an alternative, the heat generating layer may be between the magnetic tunneling junction element and the electrode of the memory cell access transistor. In addition, a conductive plug may be electrically connected between the heat generating layer and the electrode of the memory cell access transistor, and a surface area of an electrical connection between the heat generating layer and the conductive plug may be less than a surface area of the heat generating layer. In addition, a read circuit may be configured to read data from the magnetic tunneling junction element by detecting a resistance of the magnetic tunneling junction element.

According to yet additional embodiments of the present invention, methods may be provided for programming a memory device including a bit line, a magnetic tunneling junction element, and a memory cell access transistor having an electrode with the magnetic tunneling junction element being electrically connected between the bit line and the electrode of the memory cell access transistor. In particular, a heating current is generated in a first direction between the bit line and the electrode of the memory cell access transistor through the magnetic tunneling junction element while the memory cell access transistor is turned on. While generating the heating current in the first direction, a programming current is generated in a second direction with the first and second directions being different.

More particularly, the programming current may be generated through the bit line. In an alternative, the memory device may include a sub-bit line parallel with the bit line, and the programming current may be generated through the sub-bit line. In yet another alternative, the memory device may include a digit line perpendicular to the bit line, and the programming current may be generated through the digit line.

The memory device may also include a heat generating layer electrically coupled in series with the magnetic tunneling junction element between the bit line and the electrode of the memory cell access transistor, and the heat generating layer may provide a relatively high resistance with respect to electrical current flow. More particularly, the heat generating layer may be a layer of an insulating material such as aluminum oxide, silicon, silicon carbide, silicon oxide, silicon oxynitride, and/or chalcogenide material, and the heat generating layer may have a thickness less than approximately 30 Å.

The magnetic tunneling junction element may include a free layer, a tunneling insulating layer, and a pinned layer with the tunneling insulating layer being between the free and pinned layers. The magnetic tunneling junction element may also include a pinning layer on the pinned layer such that the pinned layer is between the pinning layer and the tunneling insulating layer. In addition, the free layer may be between the heat generating layer and the pinned layer, or the pinned layer may be between the heat generating layer and the free layer.

According to still additional embodiments of the present invention, a magnetic random access memory device includes a memory cell access transistor having a source region and a drain region on a substrate, an insulating layer on the memory cell access transistor and on the substrate, and a conductive contact plug through the insulating layer providing electrical connection with any one of the source and drain regions of the memory cell access transistor. In addition, a magnetic tunneling junction element is electrically connected to any one of the source and drain regions of the memory cell access transistor through the conductive plug, and a bit line is electrically connected to any one of the source and drain regions of the memory cell access transistor through the magnetic tunneling junction element and the conductive plug. A heat generating layer is also electrically connected in series with the magnetic tunneling junction element between the bit line and the conductive plug, and the heat generating layer includes a layer of an insulating material having a thickness less than approximately 30 Å.

More particularly, the heat generating layer may be a layer of a material such as aluminum oxide, undoped silicon, silicon carbide, silicon oxide, silicon oxynitride, and/or a chalcogenide material. In addition, the magnetic tunneling junction element may include a free layer, a tunneling insulating layer, and a pinned layer with the tunneling insulating layer being between the free and pinned layers. The magnetic tunneling junction element may also include a pinning layer on or under the pinned layer such that the pinned layer is between the pinning layer and the tunneling insulating layer.

The free layer may be between the heat generating layer and the pinned layer, or the pinned layer is between the heat generating layer and the free layer. The heat generating layer may be between the magnetic tunneling junction element and the bit line, and a surface area of an electrical connection between the heat generating layer and the bit line may be less than a surface area of the heat generating layer. In an alternative, the heat generating layer may be between the magnetic tunneling junction element and the conductive plug, and a surface area of an electrical connection between the heat generating layer and the conductive plug may be less than a surface area of the heat generating layer.

BRIEF DESCRIPTION OF THE DRAWINGS

FIG. 2 is a plan view of a magnetic random access memory device according to embodiments of the present invention.

DETAILED DESCRIPTION

Figure 1A:
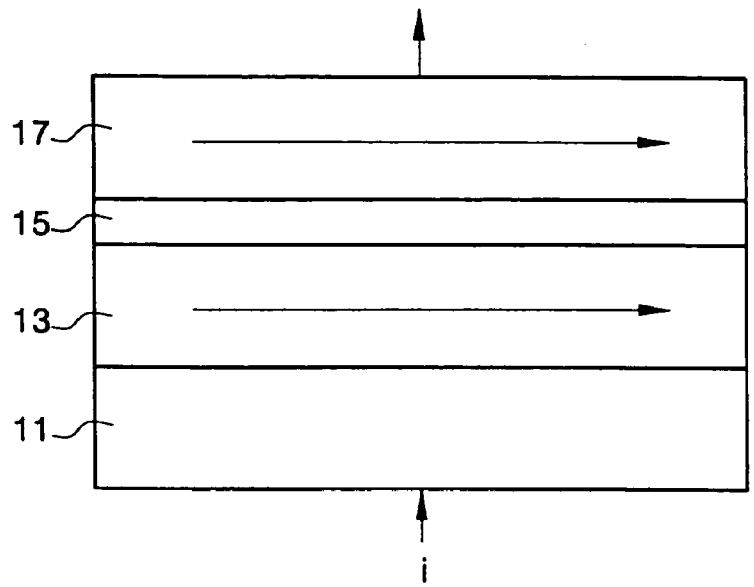
FIGS. 1A–B are cross sectional views of conventional magnetic tunneling junction elements.
Figure 1B:
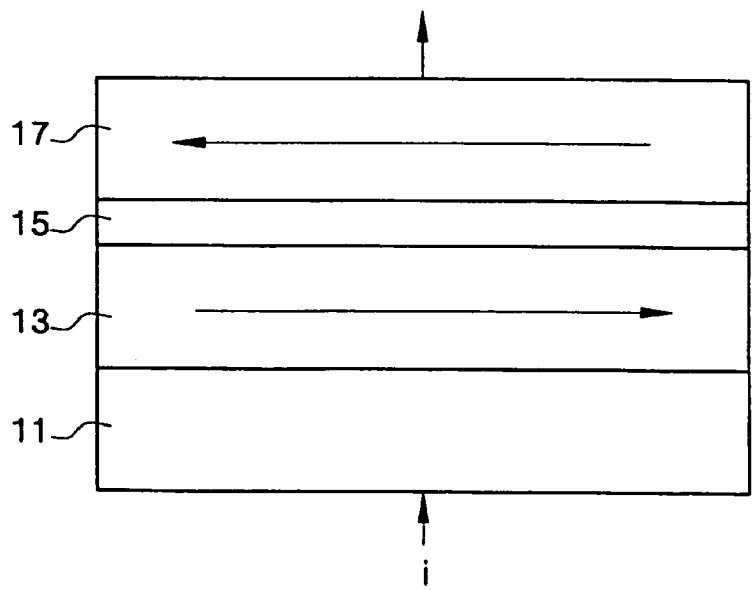

The present invention will now be described more fully with reference to the accompanying drawings, in which embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the size and the thickness of layers and regions are exaggerated for clarity. It will also be understood that when an element such as a layer, region, or substrate is referred to as being on another element, it can be directly on the other element, or intervening elements may also be present. It will also be understood that when an element is referred to as being connected to or coupled to another element, it can be directly connected to or coupled to the other element, or intervening elements may also be present. Furthermore, relative terms such as beneath may be used herein to describe one layer or regions relationship to another layer or region as illustrated in the Figures. It will be understood that these terms are intended to encompass different orientations of the device in addition to the orientation depicted in the Figures. For example, if the device in the Figures is turned over, layers or regions described as beneath other layers or regions would now be oriented above these other layers or regions. The term beneath is intended to encompass both above and beneath in this situation. Like numbers refer to like elements throughout. It will also be understood that although the terms first and second may be used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Figure 3:
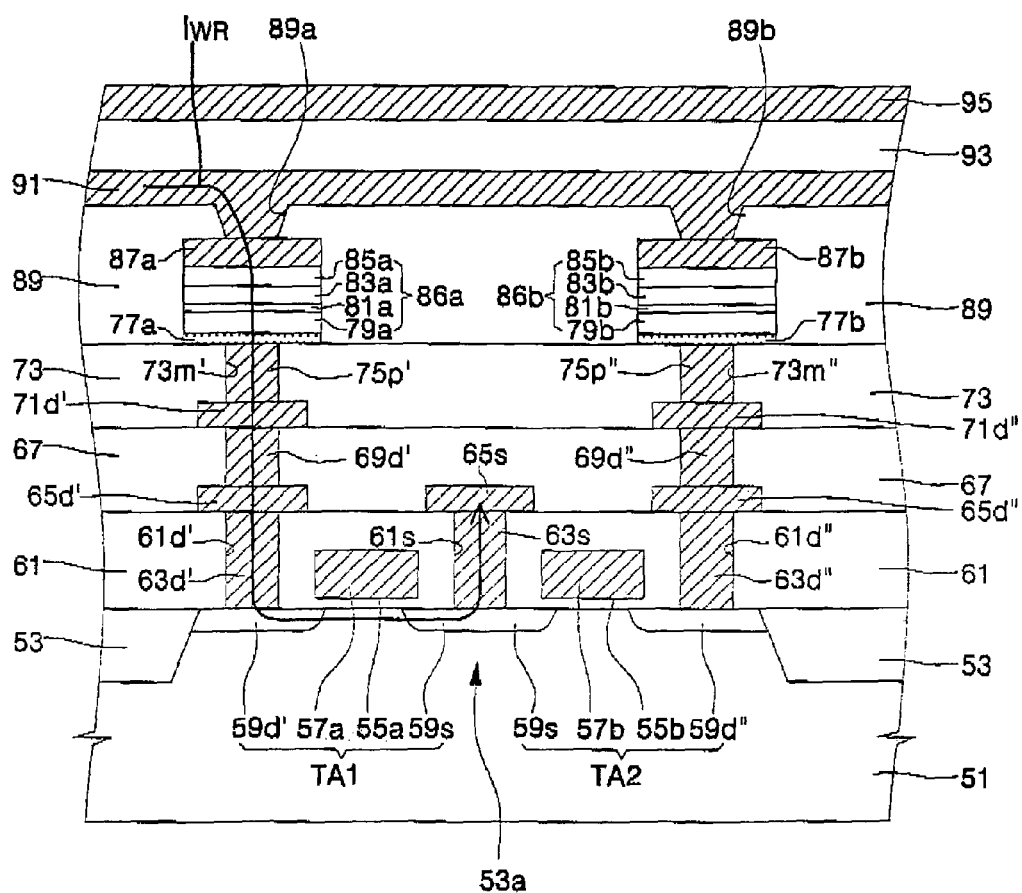
FIG. 3 is a cross sectional view taken along Section line I–I' of FIG. 2.

FIG. 2 is a plan view of a magnetic random access memory device according to embodiments of the present invention, and FIG. 3 is a cross sectional view taken along Section line I–I' of FIG. 2. As shown in FIGS. 2 and 3, a substrate 51 may include field isolation layers 53 defining an active region 53a therebetween, and first and second memory cell access transistors TA1 and TA2 may be provided on an active region of the substrate 51. The memory cell access transistors TA1 and TA2 may include respective gate insulators 55a–b, gate electrodes 57a–b, and drain regions 59d'–d" (also referred to as drain electrodes), and a common source region 59s (also referred to as a source electrode). Accordingly, the memory cell access transistors TA1 and TA2 are metal oxide semiconductor field effect transistors (MOSFETs). In an alternative, the memory cell access transistors TA1 and TA2 may be bipolar transistors.

A first interlayer dielectric (ILD) 61 may be provided on the substrate 51 and on the memory cell access transistors TA1–2, and the ILD 61 may have contact holes 61d' and 61d" exposing drain regions 59d' and 59d" and contact hole 61s exposing common source region 59s. Contact plugs 63d' and 63d" provide electrical coupling through contact holes 61d' and 61d" to drain regions 59d' and 59d", and contact plug 63s provides electrical coupling through contact hole 61s to common source region 59s. A common source line 65s may provide electrical coupling with a reference voltage source of the memory device, such as a ground voltage. The lower drain pads 65d' and 65d" may provide coupling for plugs through a next ILD.

A second interlayer dielectric (ILD) 67 may be provided on the first ILD 61, on the common source line 65s, and on the lower drain pads 65d'–d", and the second ILD 67 may have contact holes and contact plugs 69d' and 69d" therethrough providing electrical coupling to respective lower drain pads 65d'–d". Upper drain pads 71d' and 71d" may provide coupling for plugs through a next ILD.

A third interlayer dielectric (ILD) 73 may be provided on the second ILD 67 and on the upper drain pads 71d'–d". Contact holes 73m' and 73m" through the third ILD 73 may expose portions of the upper drain pads 71d'–d", and contact plugs 75p' and 75p" may provide electrical coupling through contact holes 73m'–m" to respective upper drain pads 71d'–d". Additionally, an insulating spacer (not shown) may be formed on a sidewall surface of the contact holes 73m'–m" to decrease a size of contact plugs 75p' and 75p".

Heat generating layers 77a and 77b and magnetic tunneling junction (MTJ) elements 86a and 86b may be provided on the respective contact plugs 75p' and 75p" and adjacent portions of ILD 73. More particularly, each of the heat generating layers 77a–b may include a layer of an insulating material such as aluminum oxide ($Al_2O_3$), undoped silicon, silicon carbide (SiC), silicon oxide, silicon oxynitride, (SiON), and/or a chalcogenide material, and/or combinations thereof. As will be understood by those having skill in the art, a chalcogenide material is a compound material including germanium, stibium, and tellurium. Moreover, the heat generating layers 77a–b may have thicknesses less than approximately 30 Å (Angstroms) to allow a tunneling current to pass therethrough.

Each of the MTJ elements 86a and 86b includes a respective free layer 79a–b, tunneling insulating layer 81a–b, pinned layer 83a–b, and pinning layer 85a–b. The free layer 79a–b and the pinned layer 83a–b may be layers of a ferromagnetic material such as CoFe and/or NiFe. The tunneling insulating layer 81a–b may be a layer of an insulating material such as aluminum oxide ($Al_2O_3$). The pinning layer 85a–b may be a layer of an anti-ferromagnetic material such as iron-manganese (FeMn). In addition, conductive capping layers 87a and 87b may be provided on respective MJT elements 86a and 86b, and the conductive capping layers 87a–b may be layers of a conductive material such as TiN.

The heat generating layers 77a–b, the MTJ elements 86a–b, and the conductive capping layers 87a–b can be formed using a single masking operation. For example, continuous layers of the materials of the heat generating layers, the MTJ elements, and the conductive capping layers can be formed on ILD 73 and contact plugs 75p' and 75p", and the continuous layers can be etched using a single mask to provide the mesa structure of FIG. 3.

A fourth interlayer dielectric (ILD) 89 may then be provided on the third ILD 73, on the heat generating layers 77a–b, on MTJ elements 86a–b, and on conductive capping layers 87a–b. Bit line contact holes 89a and 89b may expose portions of respective conductive capping layers 87a–b, and bit line 91 may be electrically coupled with the MTJ elements 86a–b through respective contact holes 89a–b and conductive capping layers 87a–b. A fifth ILD 93 may be provided on the bit line 91 and on the fourth ILD 89, and a sub-bit line 95 may be provided on the fifth ILD 93 in parallel with the bit line 91.

Moreover, the sub-bit line 95 may be wider than the bit line 91 as shown in FIG. 2. In addition, a width $W_M$ of each MTJ element 86a–b (parallel to the bit line 91) may be shorter than a length $L_M$ of each MTJ element 86a–b (perpendicular to the bit line 91). The easy magnetic field $H_{easy}$ axis of each MTJ element is parallel to a direction of the length $L_M$, and the easy magnetic field can be generated by passing an electrical current through the bit line 91 and/or the sub-bit line 95. The hard magnetic field of each MTJ element is parallel to a direction of the width $W_M$.

Figure 4A:
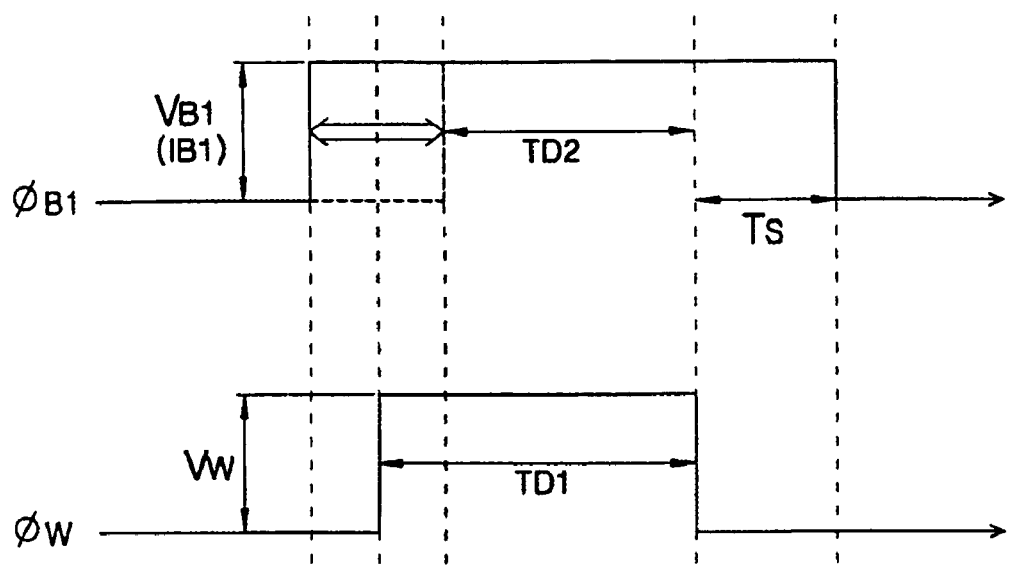
FIGS. 4A and 4B are respective signal and cross-sectional diagrams illustrating operations of programming a memory device according to embodiments of the present invention.
Figure 4B:
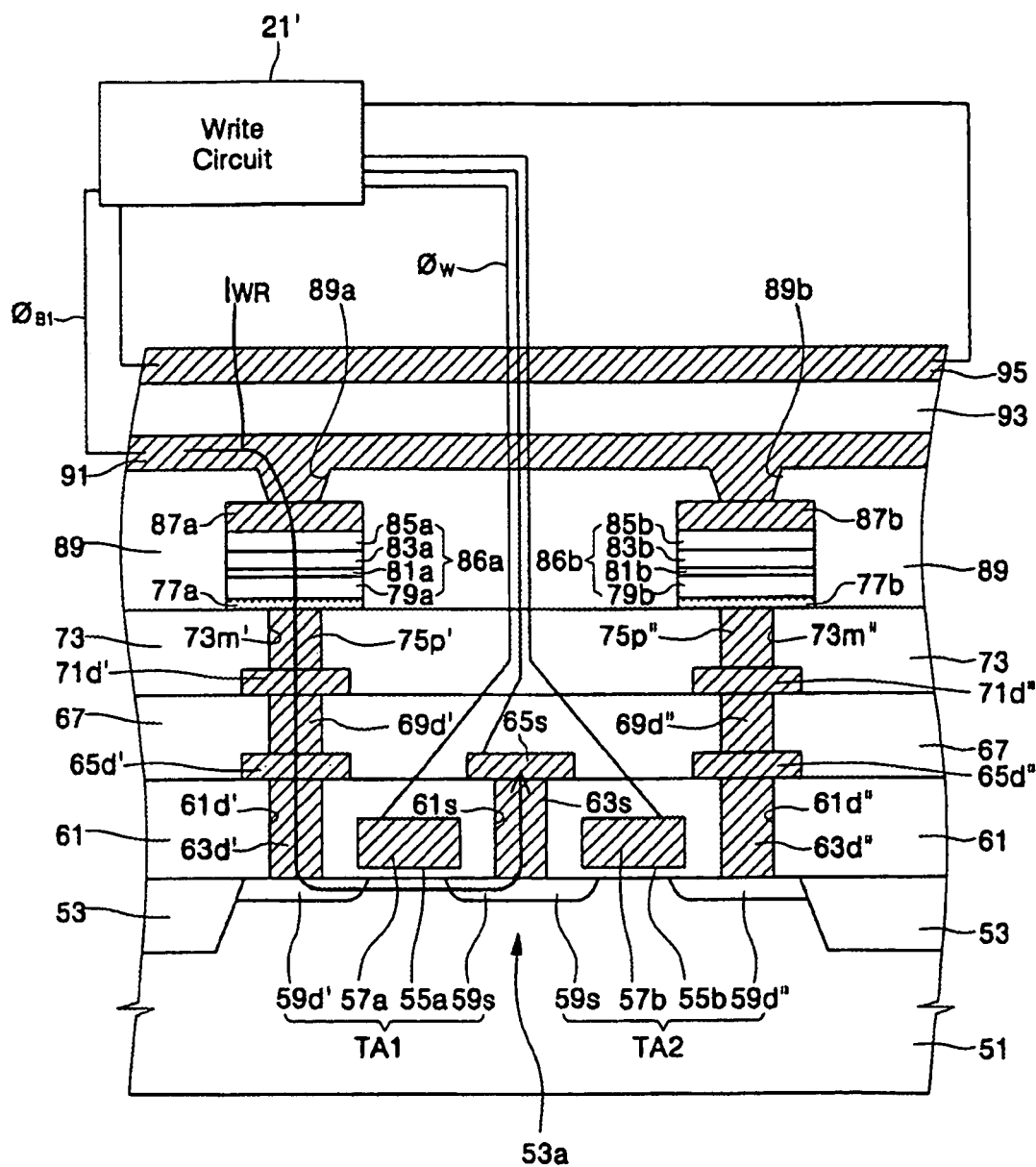

FIGS. 4A and 4B illustrate operations of programming a memory cell of the memory device illustrated in FIGS. 2 and 3 according to embodiments of the present invention. More particularly, the signal diagram of FIG. 4A illustrates signals $N_{B1}$ and $N_W$ that may be generated by the write circuit 21' of FIG. 4B during programming operations. When programming the memory cell including MTJ element 86a and memory cell access transistor TA1, a ground voltage can be applied by the write circuit 21' to the common source line 65s, and a ground voltage can be applied by the write circuit 21' to the gate electrode 57b of the memory cell access transistor TA2 to turn the memory cell access transistor TA2 off. As shown in FIGS. 4A and 4B, a first writing signal $N_W$ is applied by the write circuit 21' to the gate electrode 57a of the memory cell access transistor TA1 to selectively turn on the memory cell access transistor TA1 during the interval TD1 when the voltage level of the writing signal $N_W$ exceeds the threshold voltage threshold $V_{th}$ of the memory cell access transistor TA1 (i.e. $V_W > V_{th}$). In addition, a second writing signal $N_{B1}$ is applied by the write circuit 21' to the bit line 91 so that a positive voltage $V_{B1}$ (or a positive current $I_{B1}$) is applied to the bit line 91 at the same time the positive voltage $V_W$ is applied to the gate electrode 57a of memory cell access transistor TA1.

Accordingly, memory cell access transistor TA1 is turned on while a voltage difference is provided by the write circuit 21' between the bit line 91 and the common source line 65s and while the memory cell access transistor TA2 is turned off. A writing current $I_{WR}$ thus flows between the bit line 91 and the common source line 65s through the serially connected elements including: conductive capping layer 87a; MTJ element 86a; heat generating layer 77a; contact plugs 75p', 69d', and 63d'; contact pads 71d' and 65d'; memory cell access transistor TA1; and contact plug 63s. Moreover, heat is generated as the $I_{WR}$ current passes through the heat generating layer 77a so that the $I_{WR}$ current acts as a heat generating current, and heat from the heat generating layer 77a is transferred to the free layer 79a. By selectively heating the free layer 79a of MTJ element 86a (and not the free layer 79b of MTJ element 86b), a magnetic orientation of the free layer 79a can be changed using an external magnetic field without changing a magnetic orientation of the free layer 79b.

In the structure of FIG. 3 and 4B, a current density can be increased at an interface of the contact plug 75p' and the heat generating layer 77a because: a resistivity of the heat generating layer 77a can be higher than that of the MTJ element 86a; and a contact area between contact plug 75p' and heat generating layer 77a can be less than a surface area of contact between the MTJ element 86a and the heat generating layer 77a. Accordingly, heat can be efficiently generated by joule heating and transferred from the heat generating layer 77a to the free layer 79a as the writing current $I_{WR}$ passes through the heat generating layer 77a.

As heat is transferred to the free layer 79a of MTJ element 86a, magnetic spins of the selected free layer 79a may rotate more easily under the influence of a magnetic field than magnetic spins of the unselected free layer 79b that is not heated. More particularly, a magnetic field of the write current $I_{WR}$ may be used to rotate magnetic spins of the selected free layer 79a during a write operation while the free layer 79a is being selectively heated. In addition or in alternatives, separate currents through the bit line 91 and/or the sub-bit line 95 may be generated by the write circuit 21' used to rotate magnetic spins of the selected free layer 79a during a write operation while the free layer 79a is being selectively heated. The selected free layer 79a can thus be selectively heated so that a magnetic field generated during a write operation is sufficient to switch a magnetic orientation of the selected free layer 79a without switching an adjacent unselected free layer 79b.

As indicated by the vertical dotted lines and the arrow including two solid horizontal lines, the write signal $N_{B1}$ generated by the write circuit 21' may rise to $V_{B1}$ ($I_{B1}$) before the write signal $N_W$ rises to $V_W$; the write signal $N_{B1}$ generated by the write circuit 21' may rise to $V_{B1}$ ($I_{B1}$) at approximately the same time the write signal $N_W$ rises to $V_W$; or the write signal $N_{B1}$ generated by the write circuit 21' may rise to $V_{B1}$ ($I_{B1}$) after the write signal $N_W$ rises to $V_W$. If write signal $N_{B1}$ is at $V_{B1}$ ($I_{B1}$) when the write signal $N_W$ rises to $V_W$ and write signal $N_{B1}$ is maintained by the write circuit 21' at $V_{B1}$ ($I_{B1}$) at least as long as write signal $N_W$ is maintained at $V_W$, MTJ element 86a may be actively heated during the period TD1. If write signal $N_{B1}$ is maintained by the write circuit 21' at $V_{B1}$ ($I_{B1}$) at least as long as write signal $N_W$ is maintained at $V_W$ and write signal $N_{B1}$ rises to $V_{B1}$ ($I_{B1}$) after the write signal $N_W$ rises to $V_W$, MTJ element 86a may be actively heated during the period TD2. Moreover, the write signal $N_{B1}$ may be maintained by the write circuit 21' at $V_{B1}$ ($I_{B1}$) for some period of time $T_S$ after terminating the write signal $N_W$ (thereby terminating active heating) so that a magnetic field may continue to rotate thermally excited magnetic spins of the free layer 79a.

Figure 5A:
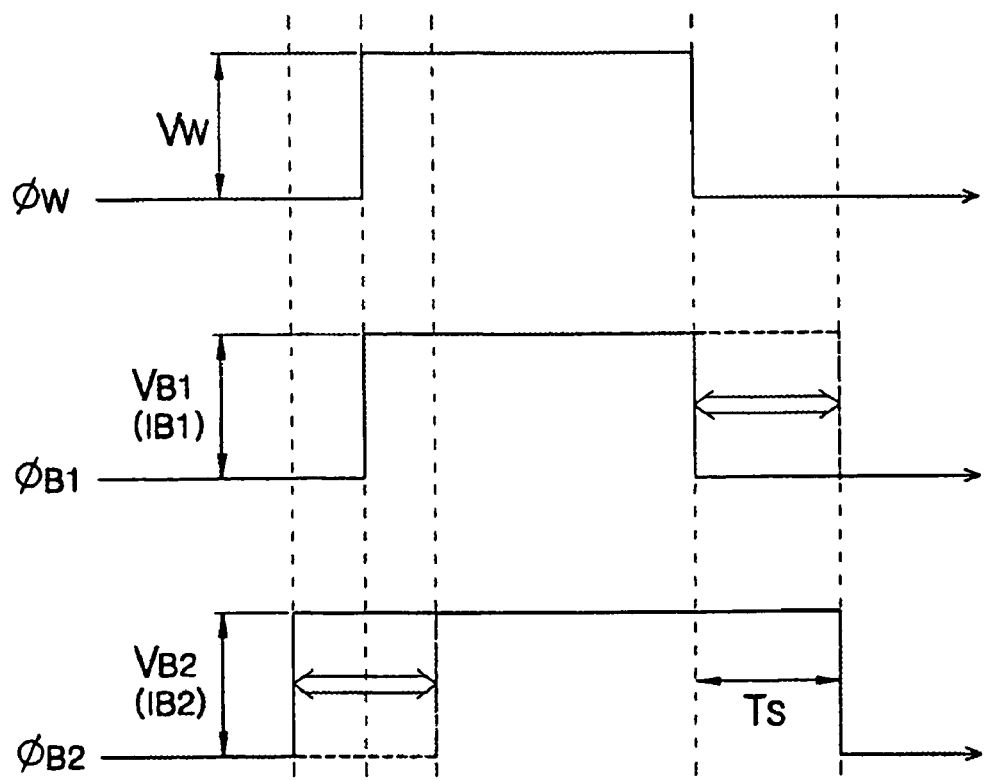
FIGS. 5A and 5B are respective signal and cross-sectional diagrams illustrating additional operations of programming a memory device according to additional embodiments of the present invention.
Figure 5B:
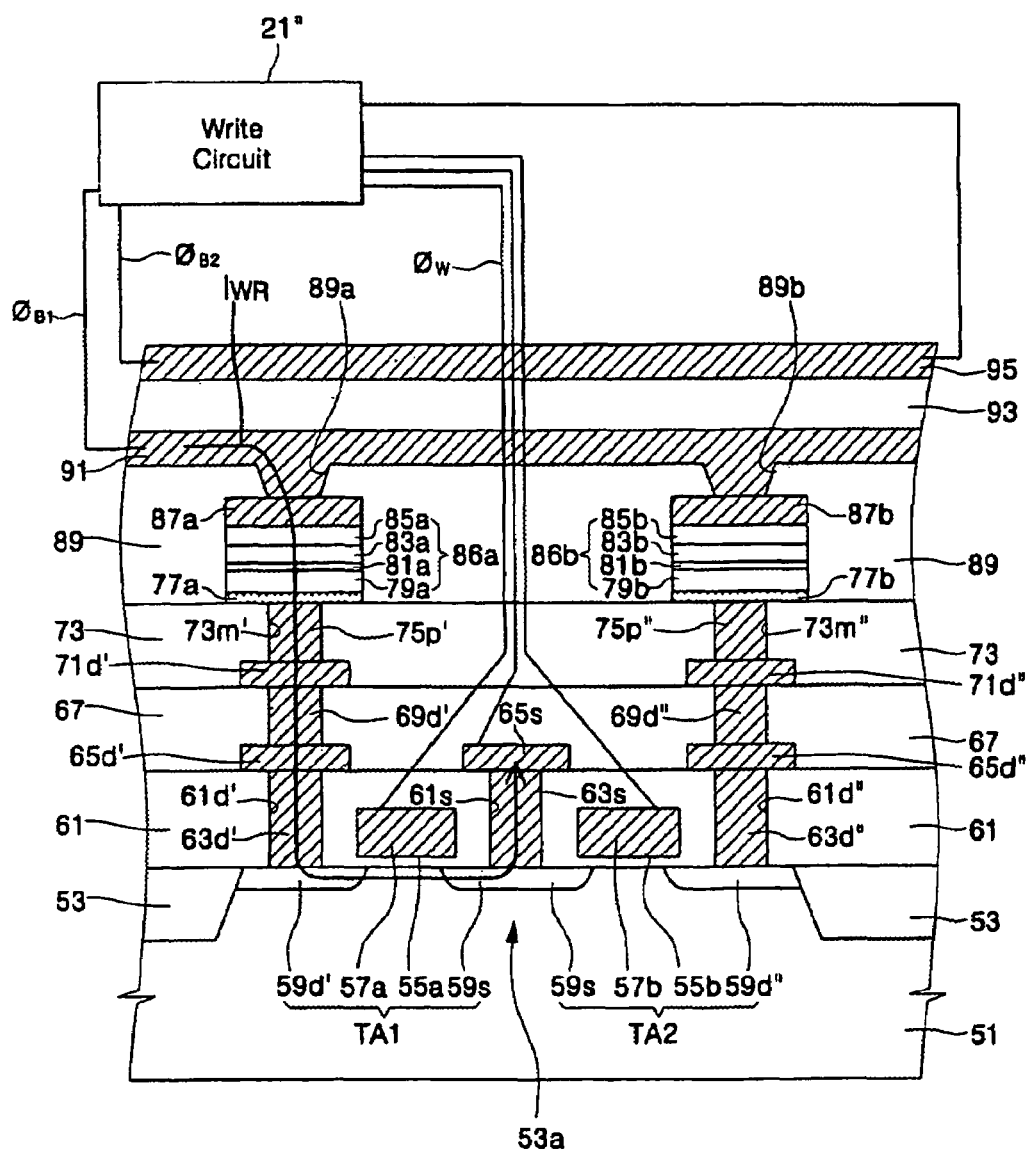

FIGS. 5A and 5B illustrate operations of programming a memory cell of the memory device illustrated in FIGS. 2, 3, and 5B according to additional embodiments of the present invention. More particularly, the signal diagram of FIG. 5A illustrates signals $N_{B1}$, $N_W$, and $N_{B2}$ that may be generated by the write circuit 21" of FIG. 5B during programming operations. When programming the memory cell including MTJ element 86a and memory cell access transistor TA1, a ground voltage can be applied by the write circuit 21" to the common source line 65s, and a ground voltage can be applied by the write circuit 21" to the gate electrode 57b of the memory cell access transistor TA2 to turn the memory cell access transistor TA2 off. As shown in FIGS. 5A and 5B, a first writing signal $N_W$ is applied by the write circuit 21" to the gate electrode 57a of the memory cell access transistor TA1 to selectively turn on the memory cell access transistor TA1 so that the voltage level of the writing signal $N_W$ exceeds the threshold voltage threshold $V_{th}$ of the memory cell access transistor TA1 (i.e. $V_W > V_{th}$). In addition, a second writing signal $N_{B1}$ is applied by the write circuit 21" to the bit line 91 so that a positive voltage $V_{B1}$ (or a positive current $I_{B1}$) is applied to the bit line 91 at a same time the positive voltage $V_W$ is applied by the write circuit 21" to the gate electrode 57a of memory cell access transistor TA1. In addition, a third writing signal $N_{B2}$ may be applied by the write circuit 21" to the sub-bit line 95 to generate a current through the sub-bit line 95 thereby generating a magnetic field.

Accordingly, memory cell access transistor TA1 is turned on while a voltage difference is provided by the write circuit 21" between the bit line 91 and the common source line 65s and while the memory cell access transistor TA2 is turned off. A writing current $I_{WR}$ thus flows between the bit line 91 and the common source line 65s through the serially connected elements including: conductive capping layer 87a; MTJ element 86a; heat generating layer 77a; contact plugs 75p', 69d', and 63d'; contact pads 71d' and 65d'; memory cell access transistor TA1; and contact plug 63s. Moreover, heat is generated as the $I_{WR}$ current passes through the heat generating layer 77a, and heat from the heat generating layer 77a is transferred to the free layer 79a. By selectively heating the free layer 79a of MTJ element 86a (and not the free layer 79b of MTJ element 86b), a magnetic orientation of the free layer 79a can be changed using the magnetic field generated by the current flowing in the sub-bit line 95 without changing a magnetic orientation of the free layer 79b.

In the structure of FIGS. 3 and 5B, a current density can be increased at an interface of the contact plug 75p' and the heat generating layer 77a because a resistivity of the heat generating layer 77a can be higher than that of the MTJ element 86a; and because a contact area between contact plug 75p' and heat generating layer 77a can be less than a surface area of contact between the MTJ element 86a and the heat generating layer 77a. Accordingly, heat can be efficiently generated by joule heating and transferred from the heat generating layer 77a to the free layer 79a as the writing current $I_{WR}$ passes through the heat generating layer 77a.

As heat is transferred to the free layer 79a of MTJ element 86a, magnetic spins of the selected free layer 79a may rotate more easily under the influence of the external magnetic field than magnetic spins of the unselected free layer 79b that is not heated. More particularly, a magnetic field of the current through the sub-bit line 95 may be used to rotate magnetic spins of the selected free layer 79a during a write operation while the free layer 79a is being selectively heated. The selected free layer 79a can thus be selectively heated so that a magnetic field generated during a write operation is sufficient to switch a magnetic orientation of the selected free layer 79a without switching a magnetic orientation of an adjacent unselected free layer 79b.

According to particular embodiments of the present invention, the contact plug 75p'–p'' may be a titanium nitride contact plug, and a contact surface area between the contact plug 75p'–p'' and the respective heat generating layer 77a–b may have a diameter of approximately 40 nm. The heat generating layer 77a–b may be a layer of an insulating material have a thickness of approximately 20 Å (Angstroms). More particularly, the heat generating layer 77a–b may be a layer of a material such as aluminum oxide ($Al_2O_3$), undoped silicon, silicon carbide (SiC), silicon oxide, silicon oxynitride, (SiON), and/or a chalcogenide material, and/or combinations thereof. The free layer 79a–b may include a layer of a ferromagnetic material such as CoFe and/or NiFe, and the free layer 79a–b may have a thickness of approximately 100 Å (Angstroms). The tunneling insulating layer 81a–b may be a layer of an insulating material such as aluminum oxide ($Al_2O_3$) having a thickness of approximately 10 Å (Angstroms). The pinned layer 83a–b may include a layer of a ferromagnetic material such as CoFe and/or NiFe, and the pinning layer 85a–b may be a layer of an anti-ferromagnetic material such as FeMn and/or PtMn. Moreover, the pinned layer 83a–b and the pinning layer 85a–b may have a combined thickness of approximately 300 Å (Angstroms). The conductive capping layer 87a–b may be a layer of titanium nitride, and the bit line may be a conductive line of tungsten (W). Moreover, a surface area of the contact between the bit line 91 and the conductive capping layer 87a–b may have a diameter of approximately 120 nm, and a diameter of the MTJ element 86a–b (in a dimension parallel to the substrate) may be approximately 240 nm.

According to particular embodiments of the present invention, the free layer 79a–b may be a compound layer including a first sub-layer of NiFe having a thickness of approximately 30 Å on the heat generating layer 77a–b and a second sub-layer of CoFe having a thickness of approximately 10 Å on the first sub-layer of NiFe opposite the heat generating layer 77a–b. The tunneling insulating layer 81a–b may be a layer of aluminum oxide having a thickness of approximately 10 Å. The pinned layer 83a–b may be a compound layer including a first sub-layer of CoFe having a thickness of approximately 30 Å on the tunneling insulating layer 81a–b; a second sub-layer of Ru having a thickness of approximately 8 Å on the first sub-layer opposite the tunneling insulating layer 81a–b; and a third sub-layer of CoFe having a thickness of approximately 30 Å on the second sub-layer of Ruthenium (Ru) opposite the first sub-layer of CoFe. Moreover, the pinning layer 85a–b may be a layer of platinum-manganese (PtMn) having a thickness of approximately 150 Å.

As indicated by the vertical dotted lines of FIG. 5, the write signal $\phi_{B1}$ may rise to $V_{B1}$ ($I_{B1}$) before the write signal $\phi_W$ rises to $V_W$; the write signal $\phi_{B1}$ may rise to $V_{B1}$ ($I_{B1}$) at approximately the same time the write signal $\phi_W$ rises to $V_W$; or the write signal $\phi_{B1}$ may rise to $V_{B1}$ ($I_{B1}$) after the write signal $\phi_W$ rises to $V_W$. Similarly, write signal $\phi_{B2}$ may rise to $V_{B2}$ ($I_{B2}$) before the write signal $\phi_W$ rises to $V_W$; the write signal $\phi_{B2}$ may rise to $V_{B2}$ ($I_{B2}$) at approximately the same time the write signal $\phi_W$ rises to $V_W$; or the write signal $\phi_{B2}$ may rise to $V_{B2}$ ($I_{B2}$) after the write signal $\phi_W$ rises to $V_W$. While both the write signals $\phi_W$ and $\phi_{B1}$ are at high levels, the current $I_{WR}$ flows between the bit line 91 and the common source line 65s, thereby generating heat at the heat generating layer 77a that is transferred to the free layer 79a.

If the free layer 79a is sufficiently heated, a magnetic field resulting from sufficient current flow through the sub-bit line 95 (responsive to the write signal $N_{B2}$ generated by the write circuit 21'') can change a magnetic orientation of the free layer 79a without changing the magnetic orientation of the free layer 79b. Some finite period of time after the current $I_{WR}$ begins to flow may pass before the free layer 77a is sufficiently heated to allow a change in magnetic orientation to begin. Moreover, the write signal $N_{B2}$ may be maintained by the write circuit 21'' at $V_{B2}$ ($I_{B2}$) for some period of time $T_S$ after ending the current $I_{WR}$ that the magnetic field resulting from current through the sub-bit line 95 may continue to change the magnetic orientation of the free layer 79a. In other words, magnetic spins of the free layer 79a may begin to rotate once the free layer is sufficiently heated after beginning the current $I_{WR}$ and the magnetic field is generated by the current through the sub-bit line 95. Moreover, magnetic spins of the free layer 79a may continue to rotate after ending the current $I_{WR}$ during interval $T_S$ as the free layer 79a begins to cool provided that the current (responsive to write signal $N_{B2}$ generated by the write circuit) through the sub-bit line 95 is maintained. A write circuit 21'' (shown as a circuit block in FIG. 5B) is configured to write data to the magnetic tunneling junction element 86a–b by generating the write signals $N_W$, $N_{B1}$, and $N_{B2}$ that are applied to the gate electrode(s) 55a–b (also referred to as word lines), the bit line(s) 91, and the sub-bit line(s) 95, respectively. Additionally, a read circuit 23 (shown as a circuit block in FIG. 2) is configured to read data from magnetic tunneling junction element 86a–b by detecting a resistance of the magnetic tunneling junction element 86a–b.

As shown in FIG. 3, respective heat generating layers 77a and 77b and MTJ elements 86a and 86b are electrically connected in series between the bit line 91 and respective drain regions 59d' and 59d'''. While particular arrangements of the MTJ elements 86a–b and heat generating layers 77a–b are shown in FIGS. 2 and 3, other arrangements can be provided according to embodiments of the present invention. For example, an order of the layers of the MTJ elements 86a–b may be reversed so that the free layers 79a–b are adjacent the respective capping layers 87a–b and the pinning layers 85a–b are adjacent the respective heat generating layers 77a–b. In another alternative, the heat generating layers 77a–b may be provided between the respective capping layers 87a–b and bit line 91.

Figure 6:
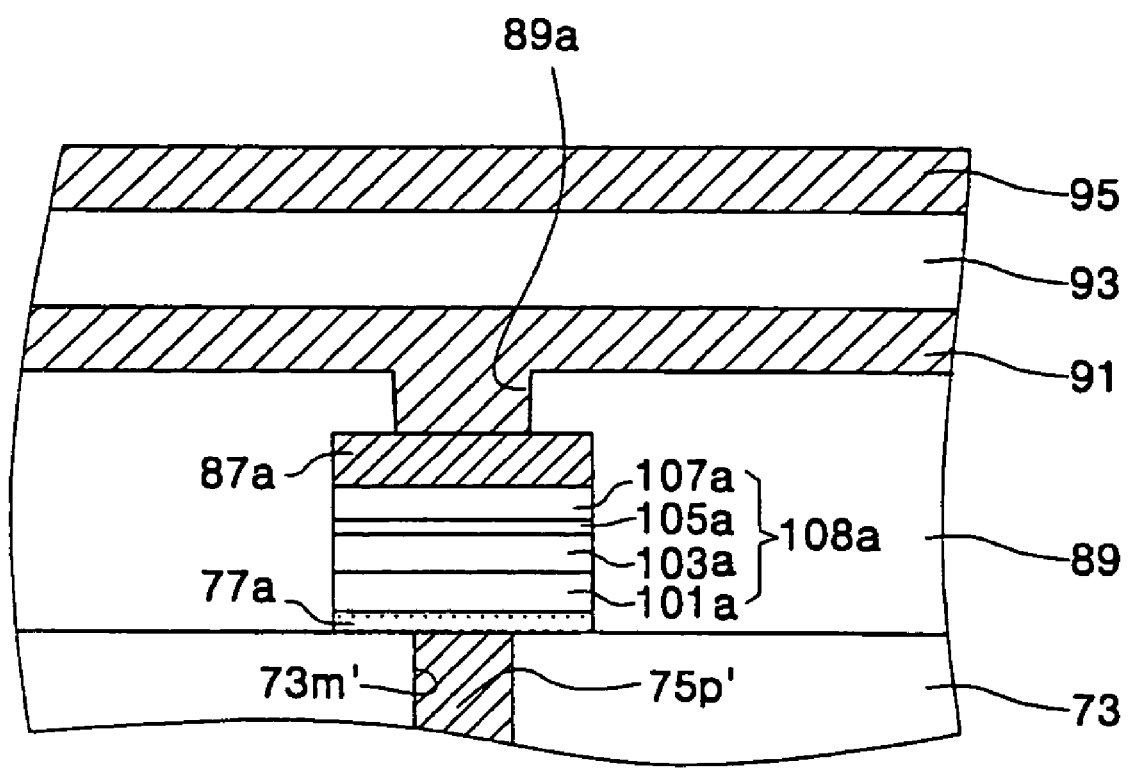
FIG. 6 is a cross sectional view of a magnetic tunneling junction element according to other embodiments of the present invention.

Additional embodiments of the present invention are illustrated in the cross sectional view of FIG. 6. In the embodiment of FIG. 6, all structures from the substrate 51 to the ILD 73 are the same as discussed above with regard to FIGS. 2 and 3. Moreover, the heat generating layer 77a, the conductive capping layer 87a, the ILD 89, the bit line 91, the ILD 93, and the sub-bit line 95 are also the same as discussed above with regard to FIGS. 2 and 3. As discussed above, the conductive capping layer may be a layer of titanium nitride (TiN), and the heat generating layer may include a layer of an insulating material such as aluminum oxide (Al$_2$O$_3$), undoped silicon, silicon carbide (SiC), silicon oxide, silicon oxynitride, (SiON), and/or a chalcogenide material, and/or combinations thereof. Moreover, the heat generating layer 77a may have thicknesses less than approximately 30 Å (Angstroms) to allow a tunneling current to pass therethrough.

In FIG. 6, however, the MTJ element 108a is substituted for the MTJ element 86a of FIG. 3. More particularly, the MTJ element 108a includes pinning layer 101a, pinned layer 103a, tunneling insulating layer 105a, free layer 107a, and the order of these layers is reversed with respect to the order of FIG. 3. The pinning layer 101a is adjacent the heat generating layer 77a, and the free layer 107a is adjacent the conductive capping layer 87a. Moreover, the pinned layer 103a is provided on the pinning layer 101a opposite the heat generating layer 77a, the tunneling insulating layer 105a is provided on the pinned layer 103a opposite the pinning layer 101a, and the free layer 107a is provided on the tunneling insulating layer 105a opposite the pinned layer 103a. Accordingly, heat generated at the heat generating layer 77a may be transferred through the pinning layer 101a, the pinned layer 103a, and the tunneling insulating layer 105a to the free layer 107a.

In addition, each of the free layer 107 and the pinned layer 103 may include layer(s) of a ferromagnetic material(s) such as CoFe and/or NiFe. Moreover, the free layer and/or the pinned layer may be a compound layer with two sub-layers of the same or different ferromagnetic material, and the free layer and/or the pinned layer may include a sub-layer of ruthenium between the sub-layers of the ferromagnetic material. The tunneling insulating layer 105a may be a layer of an insulating material such as aluminum oxide (Al$_2$O$_3$). The pinning layer 101a may be a layer of an anti-ferromagnetic material such as iron-manganese (FeMn) and/or platinum-manganese (PtMn). While a single MTJ element 108a is shown in FIG. 6, it will be understood that the structure of MTJ element 108a may be substituted for each of the MTJ elements of FIG. 3. Moreover, a magnetic orientation of the free layer 107a may be changed as discussed above with respect to FIGS. 4 and 5.

The heat generating layer 77a, the MTJ element 108a, and the conductive capping layer 87a can be formed using a single masking operation. For example, continuous layers of the materials of the heat generating layer, the MTJ element, and the conductive capping layer can be formed on ILD 73 and contact plug 75p', and the continuous layers can be etched using a single mask to provide the mesa structure of FIG. 6.

Figure 7:
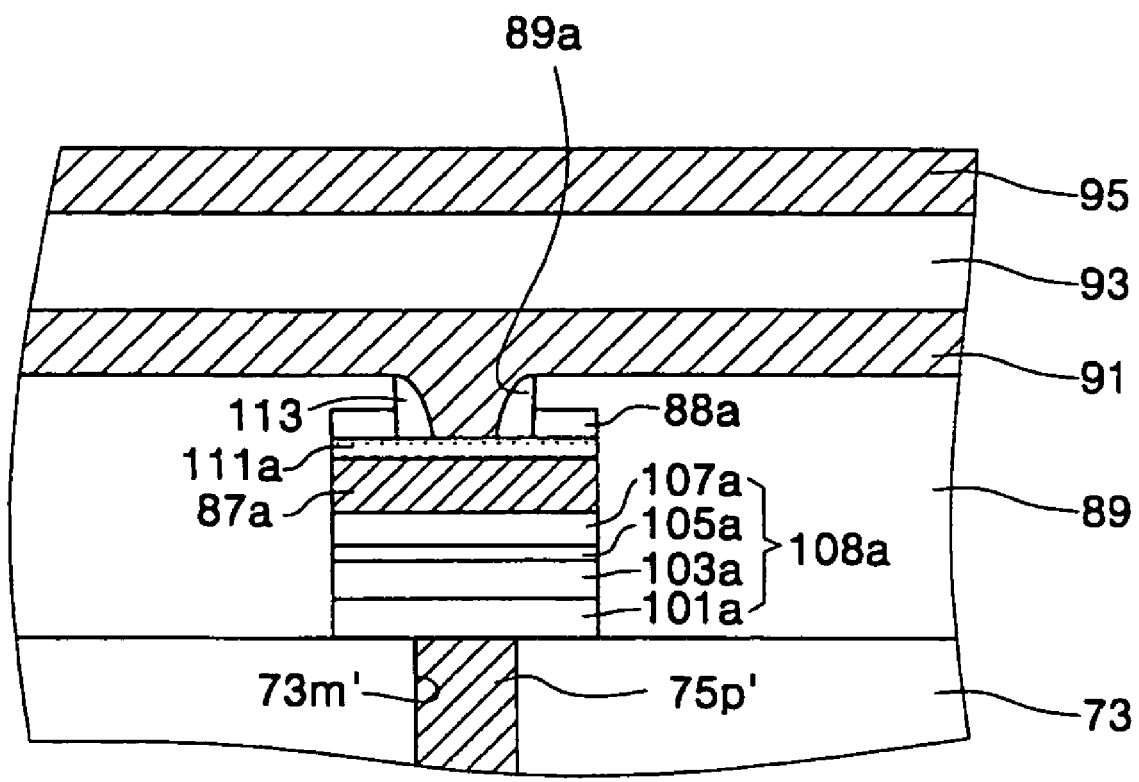
FIG. 7 is a cross sectional view of a magnetic tunneling junction element according to still other embodiments of the present invention.

Still additional embodiments of the present invention are illustrated in the cross sectional view of FIG. 7. In the embodiment of FIG. 7, all structures from the substrate 51 to the ILD 73 and contact plug 75p' are the same as discussed above with regard to FIGS. 2, 3, and 6. Moreover, the conductive capping layer 87a, the ILD 89, the bit line 91, the ILD 93, and the sub-bit line 95 are also the same as discussed above with regard to FIGS. 2, 3, and 6.

In FIG. 7, however, the heat generating layer 111a has been moved from adjacent the ILD 73 to between the conductive capping layer 87a and the bit line 91. The heat generating layer 111a may include a layer of an insulating material such as aluminum oxide (Al$_2$O$_3$), undoped silicon, silicon carbide (SiC), silicon oxide, silicon oxynitride, (SiON), and/or a chalcogenide material, and/or combinations thereof. Moreover, the heat generating layer 111a may have thicknesses less than approximately 30 Å (Angstroms) to allow a tunneling current to pass therethrough. The conductive capping layer may be a layer of titanium nitride (TiN).

In addition, an insulating capping layer 88a may be provided on the heat generating layer 111a, and a contact hole 89a may expose portions of the heat generating layer 111a through the ILD 89 and the insulating capping layer 88a. Moreover, insulating spacers 113 on sidewalls of the contact hole 89a may reduce a surface area of the heat generating layer exposed to the bit line 91. Accordingly, current density through the heat generating layer 111a can be increased to increase heat generated when the write current I$_{WR}$ passes therethrough thereby increasing an efficiency of heat generation.

The various layers of the MTJ element are the same as those discussed above with regard to FIG. 6. Accordingly, heat generated at the heat generating layer 111a may be transferred through the conductive capping layer 87a to the free layer 107. Moreover, the conductive capping layer 87a may be removed. The structure of FIG. 7 including the MTJ element 108a, conductive capping layer 87a, heat generating layer 111a, insulating capping layer 88a, and spacers 113 can thus be substituted for the structures of FIG. 3 including heat generating layer 77a–b, MTJ element 86a–b, and conductive capping layer 87a–b.

The MTJ element 108a, the conductive capping layer 87a, the heat generating layer 111a, and the insulating capping layer 88a can be formed using a single masking operation. For example, continuous layers of the materials of the MTJ element, the conductive capping layer, the heat generating layer, and the insulating capping layer can be formed on ILD 73 and contact plug 75p', and the continuous layers can be etched using a single mask to provide the mesa structure of FIG. 7. The bit line contact hole 89a can be formed through ILD 89 and insulating capping layer 88a using another masking operation.

Figure 8:
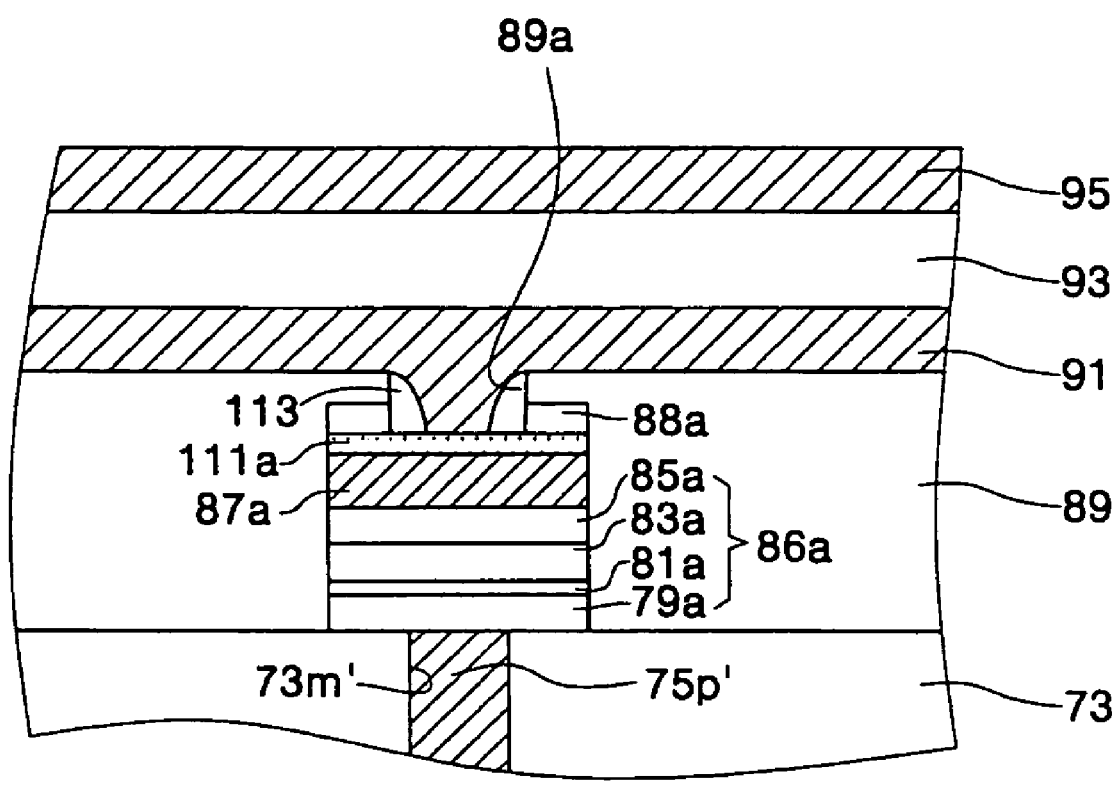
FIG. 8 is a cross sectional view of a magnetic tunneling junction element according to yet other embodiments of the present invention.

Still additional embodiments of the present invention are illustrated in the cross sectional view of FIG. 8. In the embodiment of FIG. 8, all structures from the substrate 51 to the ILD 73 and contact plug 75p' are the same as discussed above with regard to FIGS. 2, 3, 6, and 7. Moreover, the conductive capping layer 87a, the heat generating layer 111a, the insulating capping layer 88a, the spacers 113, the ILD 89, the bit line 91, the ILD 93, and the sub-bit line 95 are also the same as discussed above with regard to FIG. 7.

In FIG. 8, however, the MJT element 86a of FIG. 3 has been substituted for the MJT element 108a of FIG. 7. Accordingly, the heat generating layer 111a and the conductive capping layer 87a are between the MJT element 86a and the bit line 91. As before, the heat generating layer 111a may include a layer of an insulating material such as aluminum oxide ($Al_2O_3$), undoped silicon, silicon carbide (SiC), silicon oxide, silicon oxynitride, (SiON), and/or a chalcogenide material, and/or combinations thereof. Moreover, the heat generating layer 111a may have thicknesses less than approximately 30 Å (Angstroms) to allow a tunneling current to pass therethrough. The conductive capping layer may be a layer of titanium nitride (TiN).

In addition, an insulating capping layer 88a may be provided on the heat generating layer 111a, and a contact hole 89a may expose portions of the heat generating layer 111a through the ILD 89 and the insulating capping layer 88a. Moreover, insulating spacers 113 on sidewalls of the contact hole 89a may reduce a surface area of the heat generating layer exposed to the bit line 91. Accordingly, current density through the heat generating layer 111a can be increased to increase heat generated when the write current $I_{WR}$ passes therethrough thereby increasing an efficiency of heat generation.

The various layers of the MTJ element are the same as those discussed above with regard to FIG. 3. Accordingly, heat generated at the heat generating layer 111a may be transferred through the conductive capping layer 87a, the pinning layer 85a, the pinned layer 83a, and the tunneling insulating layer 81a to the free layer 79a. Moreover, the conductive capping layer 87a may be removed. The structure of FIG. 8 including the MTJ element 86a, conductive capping layer 87a, heat generating layer 111a, insulating capping layer 88a, and spacers 113 can thus be substituted for the structures of FIG. 3 including heat generating layer 77a–b, MJT element 86a–b, and conductive capping layer 87a–b.

The MTJ element 86a, the conductive capping layer 87a, the heat generating layer 111a, and the insulating capping layer 88a can be formed using a single masking operation. For example, continuous layers of the materials of the MTJ element, the conductive capping layer, the heat generating layer, and the insulating capping layer can be formed on ILD 73 and contact plug 75p', and the continuous layers can be etched using a single mask to provide the mesa structure of FIG. 8. The bit line contact hole 89a can be formed through ILD 89 and insulating capping layer 88a using another masking operation.

Figure 9:
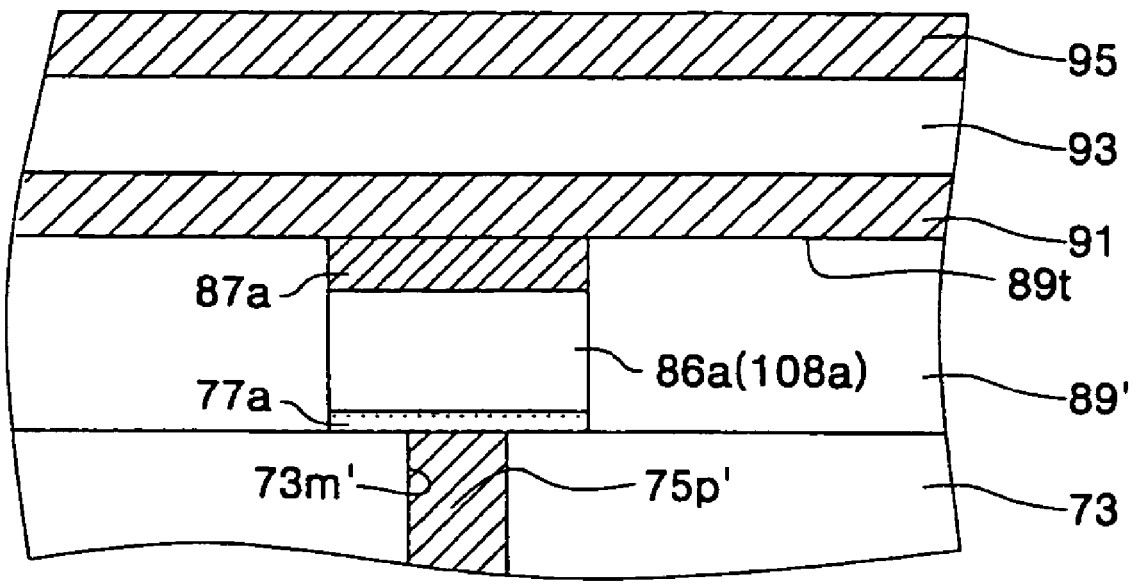
FIG. 9 is a cross sectional view of a magnetic tunneling junction element according to more embodiments of the present invention.

According to embodiments illustrated in FIG. 9, the heat generating layer 77a may be between MJT element (86a or 108a) and conductive plug 75p', and the conductive capping layer 87a may be between MJT element (86a or 108a) and bit line 91, as discussed above with regard to FIGS. 3 and 6. All structures from the substrate 51 to the ILD 73 and contact plug 75p' are the same as discussed above with regard to FIGS. 2, 3, 6, 7, and 8. Moreover, the conductive capping layer 87a, the heat generating layer 77a, the bit line 91, the ILD 93, and the sub-bit line 95 are also the same as discussed above with regard to FIGS. 3 and 6.

In FIG. 9, the interlayer dielectric (ILD) 89' may be planarized to expose an entire surface of the conductive capping layer 87a. More particularly, the interlayer dielectric material may be formed covering the ILD 73, the MJT element (86a or 108a), and the conducive capping layer 87a. The interlayer dielectric material may then be planarized (for example using chemical mechanical polishing) to provide planarized ILD 89' having a planarized surface 89t exposing an entire surface of the conductive capping layer 87a. More particularly, a chemical mechanical polish may be selected the polishes the ILD material selectively with respect to the material of the conductive capping layer 87a. Accordingly, the planarized ILD 89' may be substituted for the ILD 89 of FIG. 3 or 6. An electrical connection between the conductive capping layer 87a and the bit line 91 can thus be increased to reduce an electrical resistance therebetween.

Figure 10:
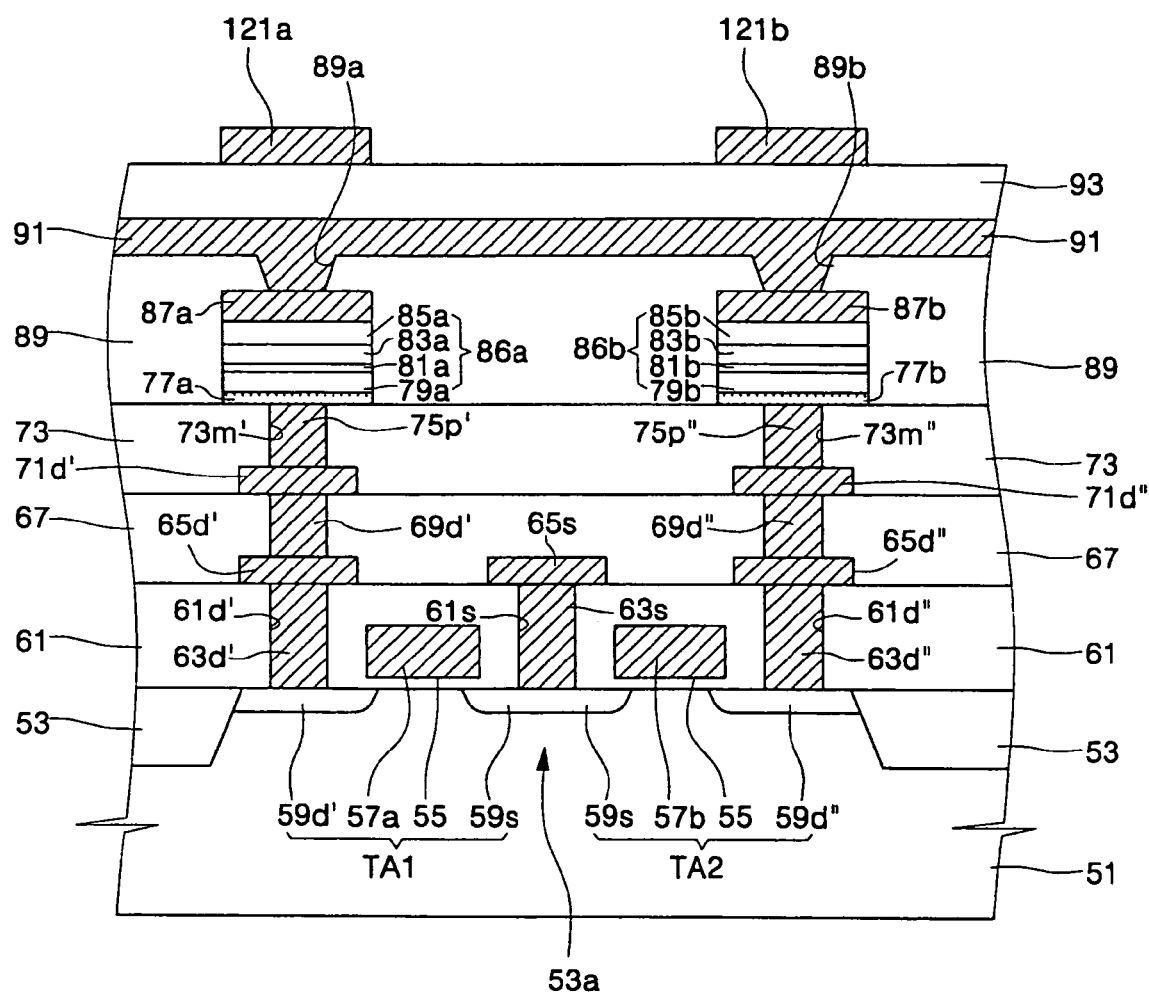
FIG. 10 is a cross sectional view of another magnetic random access memory device according to still more embodiments of the present invention.

Structures of FIGS. 6, 7, 8, and/or 9 can thus be substituted for corresponding structures of FIG. 3, and the resulting memory devices can be programmed as discussed above with respect to FIGS. 3 and 4. Alternate embodiments of the present invention are illustrated in FIG. 10. In FIG. 10, all structures from the substrate 51 to the ILD 93 are the same as discussed above with regard to FIGS. 2 and 3. In FIG. 10, however, digit lines 121a and 121b are provided on the ILD 93 perpendicular with respect to the bit line 91. In FIG. 10, current flow between the bit line 91 and the common source line 65s through the selected MTJ element 86 and heat generating layer 77a generates heat that is transferred to the free layer 79 of the selected MJT element, and current through the respective digit line 121 generates the magnetic field used to provide the desired magnetic orientation of the selected free layer 79 while heated.

Moreover, the various alternate structures of MJT elements, heat generating layers, conductive capping layers, insulating capping layers, spacers, and/or planarized ILD of FIGS. 6–9 can be substituted for the corresponding structures in FIG. 10.

Figure 11:
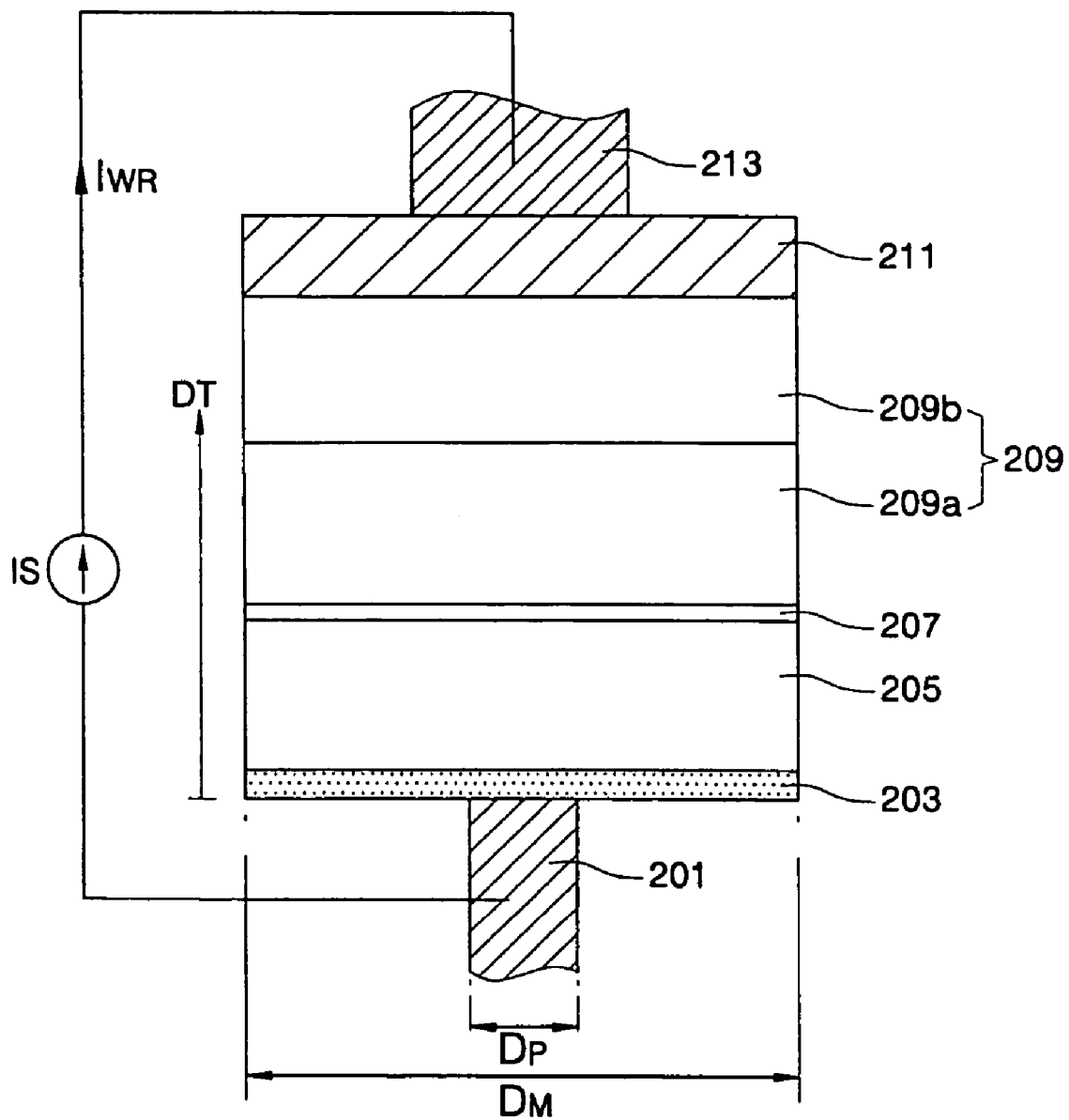
FIG. 11 is a cross sectional view of a magnetic tunneling junction element used to simulate temperature distribution characteristics according to embodiments of the present invention.

FIG. 11 is a cross sectional view of a MTJ element used to simulate temperature distributions according to embodiments of the present invention. As shown in FIG. 11, the MJT element may include a free layer 205 (approximately 100 Å thick), a tunneling insulating layer 207 (approximately 10 Å thick), and a pinned layer 209a and a pinning layer 209b (shown as combined pinned/pinning layer 209 having a combined thickness of approximately 300 Å). Moreover, the MTJ element is connected in series with the heat generating layer 203 (approximately 20 Å thick) and the conductive capping layer 211 between the MTJ contact plug 201 and the bit line contact plug 213.

A surface area of contact between the bit line contact plug 213 and the conductive capping layer 211 may have a diameter of approximately 120 nm, and a surface area of contact between the MTJ contact plug 201 and the heat generating layer 203 may have a diameter $D_P$ of approximately 40 nm. Moreover, a diameter $D_M$ of the MTJ element may be approximately 240 nm. The MTJ contact plug 201 may be a titanium nitride (TiN) contact plug, the conductive capping layer 211 may be a layer of titanium nitride (TiN), the bit line contact plug 213 may be a tungsten (W) contact plug, and the tunneling insulating layer 207 may be a layer of aluminum oxide. The free layer 205 and pinned layer 209a may include layers of CoFe and/or NiFe, the pinning layer 209b may be a layer of FeMn, and the heat generating layer 203 may be a layer of aluminum oxide ($Al_2O_3$), undoped silicon, silicon carbide (SiC), silicon oxide, silicon oxynitride, (SiON), and/or a chalcogenide material, and/or combinations thereof.

Figure 12:
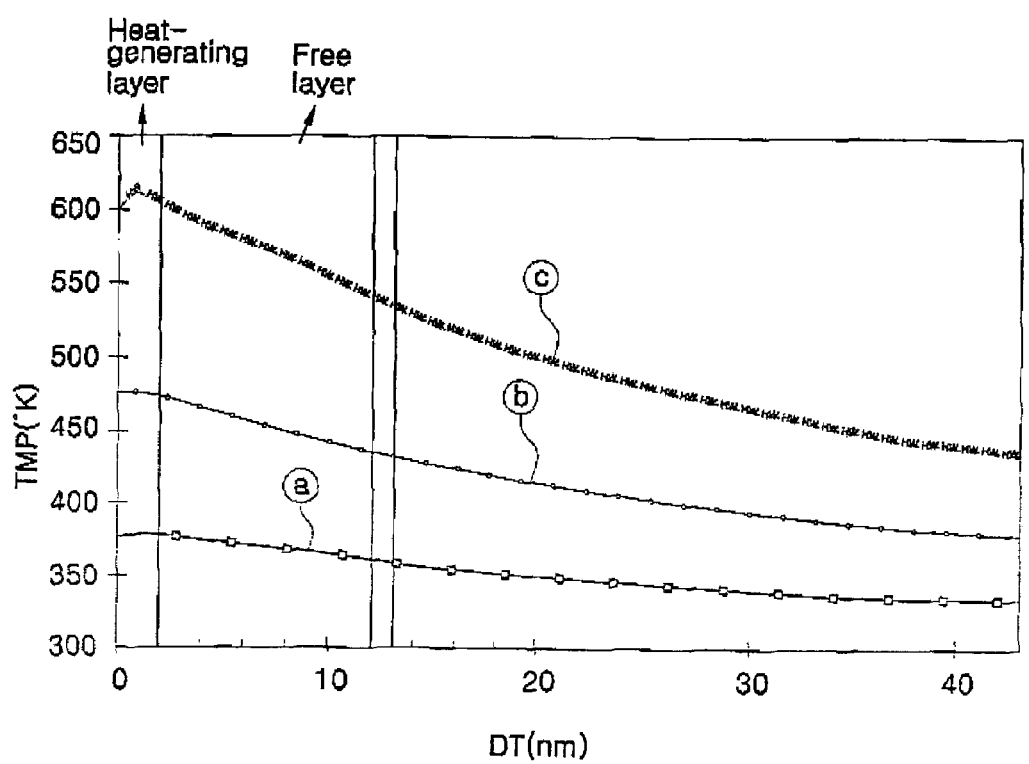
FIG. 12 is a graph illustrating simulated temperature distribution characteristics for the structure of FIG. 11.

For the purposes of the simulation illustrated in the graph of FIG. 12, write current $I_{WR}$ is generated by current source IS, the reference DT(nm) is a distance (measured in nanometers) from the heat generating layer 203 toward the conductive capping layer 211, and the reference TMP(°K) is a temperature (measured in degrees Kelvin) of the structure at the respective distances. More particularly, FIG. 12 is a graph illustrating simulated heat distributions for the structure of FIG. 11 with: $I_{WR}$=100 µA (for Curve a); $I_{WR}$=150µA (for Curve b); and $I_{WR}$=200µA (for Curve c). As shown with respect to Curve a with $I_{WR}$=100µA, the heat generating layer 203 may have a temperature of approximately 380° K, and the free layer 205 may have a temperature in the range of approximately 360° K to approximately 380° K. As shown with respect to Curve b with $I_{WR}$=150µA, the heat generating layer 203 may have a temperature of approximately 480° K, and the free layer 205 may have a temperature in the range of approximately 440° K to approximately 480° K. As shown with respect to Curve c with $I_{WR}$=200µA, the heat generating layer 203 may have a temperature in the range of approximately 600° K to approximately 610° K, and the free layer 205 may have a temperature in the range of approximately 540° K to approximately 610° K.

Figure 13:
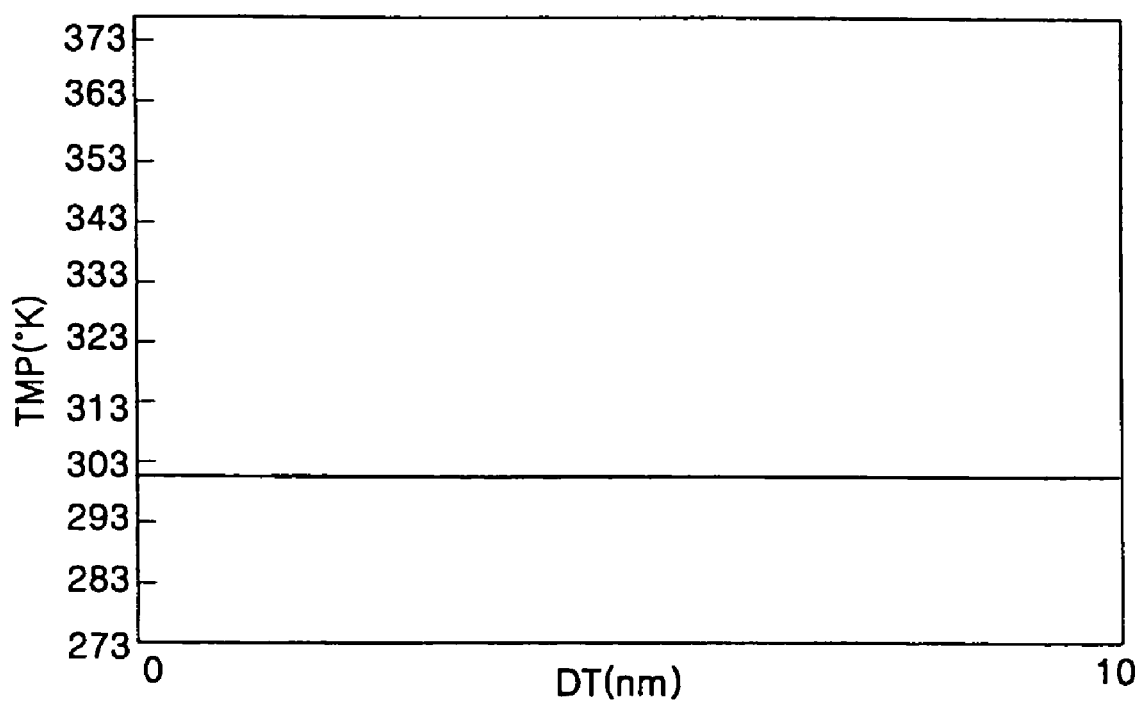
FIG. 13 is a graph illustrating simulated temperature distribution characteristics for a conventional magnetic tunneling junction element.

In contrast to FIG. 12, FIG. 13 is a graph illustrating a simulated temperature distribution characteristic for a structure similar to that of FIG. 11 without a heat generating layer. The reference DT(nm) is a distance (measured in nanometers) from the heat generating layer 203 toward the conductive capping layer 211, and the reference TMP(°K) is a temperature (measured in degrees Kelvin) of the structure at the respective distances. As shown in FIG. 13, a relatively uniform temperature distribution may be provided across a free layer in a structure without the heat generating layer. More particularly, a relatively uniform temperature of approximately 310° K may be provided across the free layer with writing currents in the range of approximately 100µA to approximately 150µA so that there is no heat variation in the free layer. By providing the heating layer 203 according to embodiments of the present invention, a temperature of the free layer 205 may thus be increased during write operations to thereby facilitate changing a magnetic orientation of the free layer.

Figure 14:
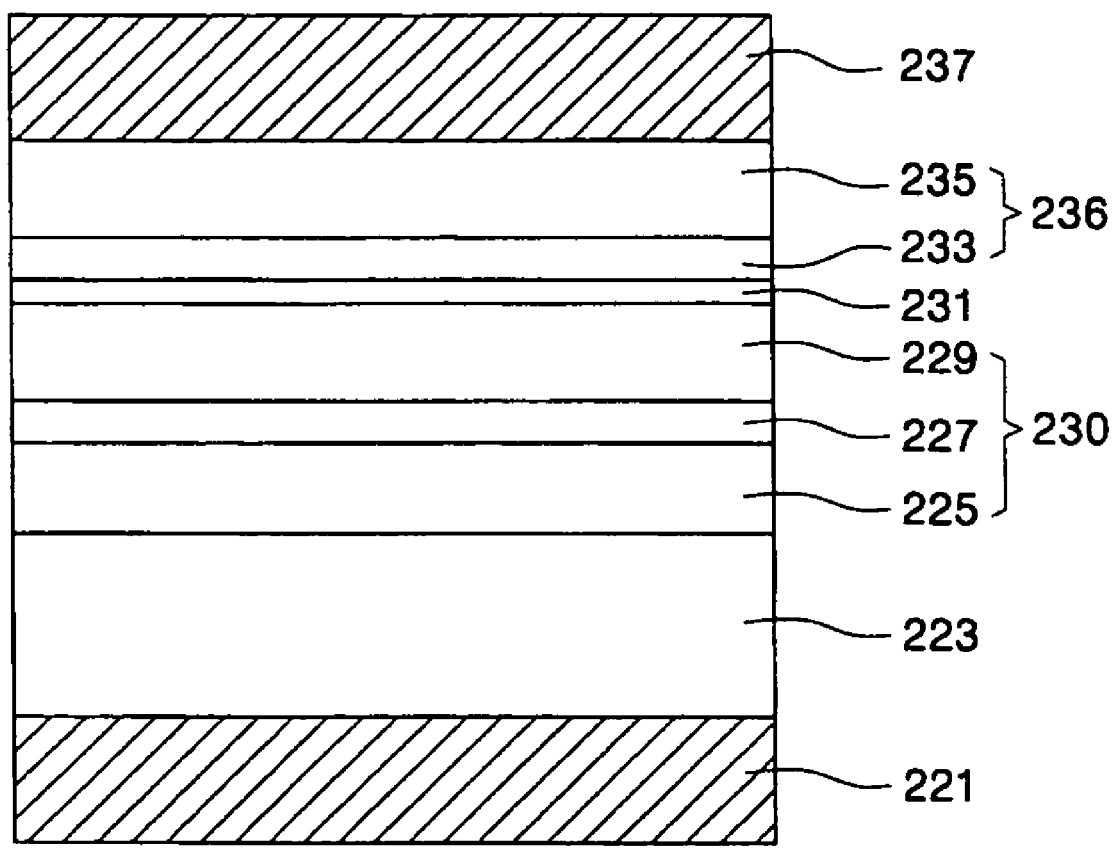
FIG. 14 is a cross sectional view of a magnetic tunneling junction element used to measure magnetization characteristics of magnetic junction tunneling elements at different temperatures.

FIG. 14 is a cross sectional view of a structure used to measure magnetization characteristics of an MJT element over a range of temperatures. The structure of FIG. 14 includes a first electrode 221 (such as a layer of TiN), a pinning layer 223 (such as a layer of PtMn having a thickness of approximately 150 Å), a pinned layer 230, a tunneling insulating layer 231 (such as a layer of $Al_2O_3$ having a thickness of approximately 10 Å), a free layer 236, and a conductive capping layer 237 (such as a layer of TiN). More particularly, the pinned layer 230 may be a compound layer including a sub-layer 225 of CoFe having a thickness of approximately 30 Å, a sub-layer 227 of Ruthenium (Ru) having a thickness of approximately 8 Å, and a sub-layer 229 of CoFe having a thickness of approximately 30 Å. Similarly, the free layer 236 may be a compound layer including sub-layer 233 of CoFe having a thickness of approximately 10 Å and sub-layer 235 of NiFe having a thickness of approximately 30 Å. Moreover, a width of the structure (parallel with the layers and the cross section) of FIG. 14 may be 0.4 µm, and a length of the structure (perpendicular to the cross section) of FIG. 14 may be approximately 0.8 µm.

Figure 15:
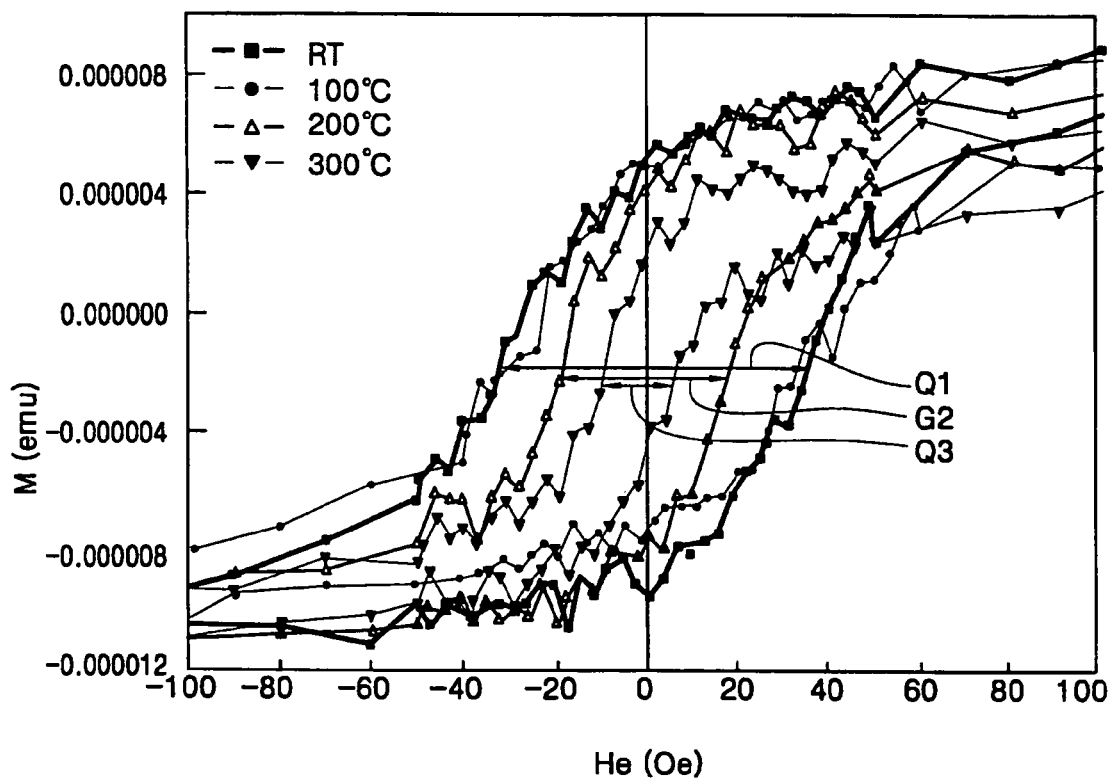
FIG. 15 is a graph illustrating hysteresis loop characteristics for structures illustrated in FIG. 14.

The graph of FIG. 15 is a hysteresis loop generated using 100,000 MTJ structures as illustrated in FIG. 14 at room temperature, in an oven at approximately 100° C., in an oven at approximately 200° C., and in an oven at approximately 300° C., with the x-axis labeled He(Oe) and the y-axis labeled M(emu). As shown, a width (Q1, Q2, Q3) of the hysteresis loop may decrease as the temperature increases. More particularly, an easy magnetic switching field (He) may decrease to less than 20 Oe (Oested) at temperatures in the range of approximately 200° C. to approximately 300° C. A magnetic spin of the free layer of a selected MTJ element may thus be more easily rotated if that free layer is heated to a temperature in the range of approximately 200° C. to approximately 300° C. while applying a writing current to the bit line, sub-bit line, and/or digit line to generate a magnetizing force of 20 Oe.

Figure 16:
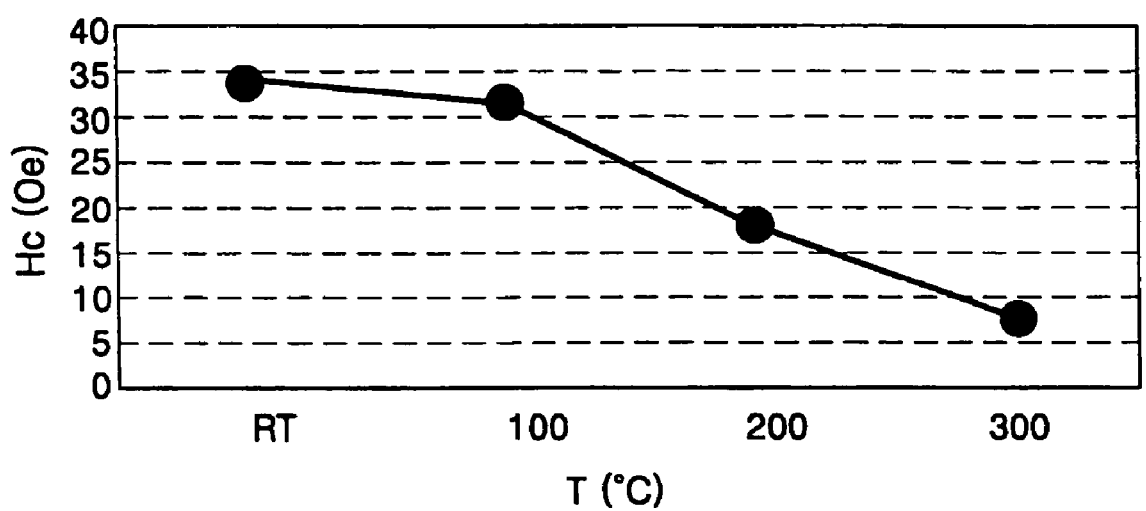
FIG. 16 is a graph illustrating a relationship between a coercive magnetic field of a magnetic tunneling junction element and a temperature of the magnetic tunneling junction element.

Moreover, a coercive field $H_C$ of an MTJ element may decrease rapidly when a temperature of the MTJ element is elevated to greater than 200° C. as shown in FIG. 16. When the temperature of an MTJ element is increased from room temperature RT to 100° C., a variation of $H_C$ may be less than 3 Oe. Accordingly, the magnetic field required to switch the MTJ element can be reduced. According to particular embodiments of the present invention, it may be desired that a free layer of an MTJ element should be heated to a temperature greater than 200° C. to successfully program a selected MTJ element to reduce writing disturbances with respect to non-selected MTJ elements on the same device.

While this invention has been particularly shown and described with reference to embodiments thereof, it will be understood by those skilled in the art that various changes in form and details may be made therein without departing from the spirit and scope of the invention as defined by the appended claims.

That which is claimed is:

1. A magnetic random access memory device comprising:
   a first electrode on a substrate;
   a magnetic tunneling junction element electrically connected to the electrode;
   a second electrode electrically connected to the first electrode through the magnetic tunneling junction element; and
   a heat generating layer wherein the heat generating layer and the magnetic tunneling junction element are electrically connected in series between the first and second electrodes, the heat generating layer including a layer of an insulating material.

2. A magnetic random access memory according to claim 1 wherein the first electrode comprises an electrode of a memory cell access transistor and wherein the second electrode comprises a bit line.

3. A magnetic random access memory device according to claim 1 wherein the insulating material comprises at least one of aluminum oxide, insulating silicon, insulating silicon carbide, silicon oxide, silicon oxynitride, and/or a chalcogenide material.

4. A magnetic random access memory device according to claim 1 wherein the heat generating layer has a thickness less than approximately 30 Å (Angstroms).

5. A magnetic random access memory device according to claim 1 wherein the magnetic tunneling junction element comprises a free layer, a tunneling insulating layer, and a pinned layer with the tunneling insulating layer being between the free and pinned layers.

6. A magnetic random access memory device according to claim 5 wherein the magnetic tunneling junction element further comprises a pinning layer on or under the pinned layer such that the pinned layer is between the pinning layer and the tunneling insulating layer.

7. A magnetic random access memory device according to claim 5 wherein the free layer is between the heat generating layer and the pinned layer.

8. A magnetic random access memory device according to claim 5 wherein the pinned layer is between the heat generating layer and the free layer.

9. A magnetic random access memory device according to claim 5 wherein the heat generating layer is between the magnetic tunneling junction element and the second electrode wherein the second electrode comprises a bit line.

10. A magnetic random access memory device according to claim 9 wherein a surface area of an electrical connection between the heat generating layer and the bit line is less than a surface area of the heat generating layer.

11. A magnetic random access memory device according to claim 5 wherein the heat generating layer is between the magnetic tunneling junction element and the first electrode on the substrate.

12. A magnetic random access memory device according to claim 11 further comprising:
a conductive plug electrically connected between the heat generating layer and the first electrode on the substrate wherein a surface area of an electrical connection between the heat generating layer and the conductive plug is less than a surface area of the heat generating layer.

13. A magnetic random access memory device according to claim 1 further comprising:
a write circuit configured to write data to the magnetic tunneling junction element by generating a heating current between the first and second electrodes through the magnetic tunneling junction element and the heat generating layer and by generating a programming current in a direction different than a direction of the heating current.

14. A magnetic random access memory device according to claim 13 wherein the second electrode comprises a bit line, and wherein the write circuit is configured to generate the programming current through the bit line.

15. A magnetic random access memory device according to claim 1 wherein the second electrode comprises a bit line, the magnetic random access memory device further comprising:
an insulating layer on the bit line so that the bit line is between the insulating layer and the magnetic tunneling junction element; and
a sub-bit line on the insulating layer so that the insulating layer is between the sub-bit line and the bit line.

16. A magnetic random access memory device according to claim 15 wherein the sub-bit line and the bit line are parallel.

17. A magnetic random access memory device according to claim 15 further comprising:
a write circuit configured to write data to the magnetic tunneling junction element by generating a heating current between the first electrode and the bit line through the magnetic tunneling junction element and the heat generating layer and by generating a programming current through the sub-bit line while generating the heating current.

18. A magnetic random access memory device according to claim 1 wherein the second electrode comprises a bit line, the magnetic random access memory device further comprising:
an insulating layer on the bit line so that the bit line is between the insulating layer and the magnetic tunneling junction element;
a digit line on the insulating layer so that the insulating layer is between the digit line and the bit line; and
a write circuit configured to write data to the magnetic tunneling junction element by generating a heating current between the first electrode and the bit line through the magnetic tunneling junction element and the heat generating layer and by generating a programming current though the digit line while generating the heating current.

19. A magnetic random access memory device according to claim 1 wherein the heat generating layer including the layer of the insulating material is configured to allow tunneling current to pass therethrough.

20. A magnetic random access memory device comprising:
a memory cell access transistor including an electrode on a substrate;
a magnetic tunneling junction element electrically connected to the electrode of the memory cell access transistor;
a bit line electrically connected to the electrode of the memory cell access transistor through the magnetic tunneling junction element; and
a write circuit configured to write data to the magnetic tunneling junction element by generating a heating current between the bit line and the electrode of the memory cell access transistor through the magnetic tunneling junction element while the memory cell access transistor is turned on, and by generating a programming current in a direction different than a direction of the heating current while generating the heating current.

21. A magnetic random access memory device according to claim 20 further comprising:
an insulating layer on the bit line so that the bit line is between the insulating layer and the magnetic tunneling junction element; and
a sub-bit line on the insulating layer so that the insulating layer is between the sub-bit line and the bit line wherein the write circuit is configured to generate the programming current through the sub-bit line while generating the heating current.

22. A magnetic random access memory device according to claim 21 wherein the sub-bit line and the bit line are parallel.

23. A magnetic random access memory device according to claim 20 further comprising:
an insulting layer on the bit line so that the bit line is between the insulating layer and the magnetic tunneling junction element; and
a digit line on the insulating layer so the insulating layer is between the digit line and the bit line wherein the write circuit is configured to generate the programming current through the digit line while generating the heating current, and wherein the digit line and the bit line are perpendicular.

24. A magnetic random access memory device according to claim 20 wherein the write circuit is configured to generate the programming current through the bit line.

25. A magnetic random access memory device according to claim 20 further comprising:
a heat generating layer wherein the heat generating layer and the magnetic tunneling junction element are electrically connected in series between the bit line and the electrode of the memory cell access transistor so that the heating current passes through both the magnetic tunnel junction element and the heat generating layer, the heat generating layer providing a relatively high resistance with respect to electrical current flow.

26. A magnetic random access memory device according to claim 25 wherein the heat generating layer comprises a layer of an insulating material.

27. A magnetic random access memory device according to claim 26 wherein the insulating material comprises at least one of aluminum oxide, insulating silicon, insulating silicon carbide, silicon oxide, silicon oxynitride, and/or a chalcogenide material.

28. A magnetic random access memory device according to claim 25 wherein the heat generating layer has a thickness less than approximately 30 Å (Angstroms).

29. A magnetic random access memory device according to claim 25 wherein the magnetic tunneling junction element comprises a free layer, a tunneling insulating layer, and a pinned layer with the tunneling insulating layer being between the free and pinned layers.

30. A magnetic random access memory device according to claim 29 wherein the magnetic tunneling junction element further comprises a pinning layer on or under the pinned layer such that the pinned layer is between the pinning layer and the tunneling insulating layer.

31. A magnetic random access memory device according to claim 29 wherein the free layer is between the heat generating layer and the pinned layer.

32. A magnetic random access memory device according to claim 29 wherein the pinned layer is between the heat generating layer and the free layer.

33. A magnetic random access memory device according to claim 29 wherein the heat generating layer is between the magnetic tunneling junction element and the bit line.

34. A magnetic random access memory device according to claim 33 wherein a surface area of an electrical connection between the heat generating layer and the bit line is less than a surface area of the heat generating layer.

35. A magnetic random access memory device according to claim 29 wherein the heat generating layer is between the magnetic tunneling junction element and the electrode of the memory cell access transistor.

36. A magnetic random access memory device according to claim 35 further comprising:
a conductive plug electrically connected between the heat generating layer and the electrode of the memory cell access transistor wherein a surface area of an electrical connection between the heat generating layer and the conductive plug is less than a surface area of the heat generating layer.

37. A method of programming a memory device including a bit line, a magnetic tunneling junction element, and a memory cell access transistor having an electrode, wherein the magnetic tunneling junction element is electrically connected between the bit line and the electrode of the memory cell access transistor, the method comprising:
generating a heating current in a first direction between the bit line and the electrode of the memory cell access transistor through the magnetic tunneling junction element while the memory cell access transistor is turned on; and
generating a programming current in a second direction while generating the heating current in the first direction, wherein the first and second directions are different.

38. A method according to claim 37 wherein the programming current is generated through the bit line.

39. A method according to claim 37 wherein the memory device includes a sub-bit line parallel with the bit line and wherein the programming current is generated through the sub-bit line.

40. A method according to claim 37 wherein the memory device includes a digit line perpendicular to the bit line and wherein the programming current is generated through the digit line.

41. A method according to claim 37 wherein the memory device includes a heat generating layer electrically coupled in series with the magnetic tunneling junction element between the bit line and the electrode of the memory cell access transistor wherein the heat generating layer provides a relatively high resistance with respect to electrical current flow.

42. A method according to claim 41 wherein the heat generating layer comprises an insulating material.

43. A method according to claim 42 wherein the insulating material comprises at least one of aluminum oxide, insulatina silicon, insulating silicon carbide, silicon oxide, silicon oxynitride, and!or chalcogenide material.

44. A method according to claim 41 wherein the heat generating layer has a thickness less than approximately 30 Å (Angstroms).

45. A method according to claim 37 wherein the magnetic tunneling junction element comprises a free layer, a tunneling insulating layer, and a pinned layer with the tunneling insulating layer being between the free and pinned layers.

46. A method according to claim 45 wherein the magnetic tunneling junction element further comprises a pinning layer on the pinned layer such that the pinned layer is between the pinning layer and the tunneling insulating layer.

47. A method according to claim 45 wherein the free layer is between the heat generating layer and the pinned layer.

48. A method according to claim 45 wherein the pinned layer is between the heat generating layer and the free layer.

49. A magnetic random access memory device comprising:
a memory cell access transistor on a substrate, the memory cell access transistor including a source and a drain region;
an insulating layer on the memory cell access transistor and on the substrate;
a conductive contact plug through the insulating layer providing electrical connection with any one of the source and drain regions of the memory cell access transistor;
a magnetic tunneling junction element electrically connected to any one of the source and drain regions of the memory cell access transistor through the conductive plug;
a bit line electrically connected to any one of the source and drain regions of the memory cell access transistor through the magnetic tunneling junction element and the conductive plug; and
a heat generating layer wherein the heat generating layer and the magnetic tunneling junction element are electrically connected in series between the bit line and the conductive plug, the heat generating layer comprising a layer of an insulating material having a thickness less than approximately 30 Å (Angstroms).

50. A magnetic random access memory device according to claim 49 wherein the insulating material comprises a material selected from the group consisting of aluminum oxide, insulating silicon, insulating silicon carbide, silicon oxide, silicon oxynitride, and/or a chalcogenide material.

51. A magnetic random access memory device according to claim 49 wherein the magnetic tunneling junction element comprises a free layer, a tunneling insulating layer, and a pinned layer with the tunneling insulating layer being between the free and pinned layers.

52. A magnetic random access memory device according to claim 51 wherein the magnetic tunneling junction element further comprises a pinning layer on or under the pinned layer such that the pinned layer is between the pinning layer and the tunneling insulating layer.

53. A magnetic random access memory device according to claim 51 wherein the free layer is between the heat generating layer and the pinned layer.

54. A magnetic random access memory device according to claim 51 wherein the pinned layer is between the heat generating layer and the free layer.

55. A magnetic random access memory device according to claim 49 wherein the heat generating layer is between the magnetic tunneling junction element and the bit line.

56. A magnetic random access memory device according to claim 55 wherein a surface area of an electrical connection between the heat generating layer and the bit line is less than a surface area of the heat generating layer.

57. A magnetic random access memory device according to claim 51 wherein the heat generating layer is between the magnetic tunneling junction element and the conductive plug.

58. A magnetic random access memory device according to claim 57 wherein a surface area of an electrical connection between the heat generating layer and the conductive plug is less than a surface area of the heat generating layer.

59. A magnetic random access memory device according to claim 20 further comprising:

a heat generating layer wherein the heat generating layer and the magnetic tunneling junction element are electrically connected in series between the bit line and the electrode of the memory cell access transistor so that the heating current passes through both the magnetic tunnel junction element and the heat generating layer, the heat generating layer including a layer of an insulating material.

60. A magnetic random access memory device according to claim 59 wherein the heat generating layer including the layer of the insulating material is configured to allow tunneling current to pass therethrough.

61. A method according to claim 37 wherein the memory device includes a heat generating layer electrically coupled in series with the magnetic tunneling junction element between the bit line and the electrode of the memory cell access transistor wherein the heat generating layer includes a layer of an insulating material.

62. A method according to claim 61 wherein the heat generating layer including the layer of the insulating material is configured to allow tunneling current to pass therethrough.

63. A magnetic random access memory device according to claim 49 wherein the layer of the insulating material is configured to allow tunneling current to pass therethrough.

* * * * *

UNITED STATES PATENT AND TRADEMARK OFFICE
CERTIFICATE OF CORRECTION

PATENT NO. : 7,092,283 B2 Page 1 of 1
APPLICATION NO. : 10/795600
DATED : August 15, 2006
INVENTOR(S) : Jeong et al.

It is certified that error appears in the above-identified patent and that said Letters Patent is hereby corrected as shown below:

On the Title Page,
Section 56 should include:

Under U.S. PATENT DOCUMENTS,
2002/0141231  A1   10/2002   Komori

Under FOREIGN PATENT DOCUMENTS,
EP    1 376 602 A2  1/2004
WO   03/094170 A2  11/2003
WO   03/092014 A1  11/2003
WO   00/04551    01/2000

Under OTHER PUBLICATIONS,
Translation of an Office Action issued by German Patent and Trademark Office February 16, 2006 for 10-2004-043-264.3-33

Column 22,
Line 17 should read -- con oxynitride, and/or chalcogenide material. --

Signed and Sealed this

Fifth Day of December, 2006

JON W. DUDAS
*Director of the United States Patent and Trademark Office*